(12) United States Patent
Nakatani et al.

(10) Patent No.: US 8,536,963 B2
(45) Date of Patent: Sep. 17, 2013

(54) ELECTRONIC DEVICE AND METHOD OF MANUFACTURING THE SAME

(75) Inventors: Tadashi Nakatani, Kawasaki (JP); Hiroaki Inoue, Kawasaki (JP); Hitoshi Yamada, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 655 days.

(21) Appl. No.: 12/783,124

(22) Filed: May 19, 2010

(65) Prior Publication Data

US 2010/0294633 A1 Nov. 25, 2010

(30) Foreign Application Priority Data

May 21, 2009 (JP) .................................. 2009-123448
Mar. 11, 2010 (JP) .................................. 2010-055045

(51) Int. Cl.
*H01H 51/22* (2006.01)
(52) U.S. Cl.
USPC ............................................ 335/78; 200/181
(58) Field of Classification Search
USPC .......................................... 335/78; 200/181
See application file for complete search history.

(56) References Cited

U.S. PATENT DOCUMENTS

| 6,734,513 | B2 * | 5/2004 | Seki et al. ...................... 257/422 |
| 6,753,487 | B2 * | 6/2004 | Fujii et al. ...................... 200/181 |
| 7,893,798 | B2 * | 2/2011 | Foster et al. ...................... 335/78 |
| 2009/0120772 | A1 * | 5/2009 | Namose ........................ 200/181 |

FOREIGN PATENT DOCUMENTS

| JP | 2005-251898 A1 | 9/2005 |
| JP | 2007-88189 A1 | 4/2007 |
| JP | 2007-160492 A1 | 6/2007 |

* cited by examiner

*Primary Examiner* — Bernard Rojas
(74) *Attorney, Agent, or Firm* — Kratz, Quintos & Hanson, LLP

(57) ABSTRACT

An electronic device includes a substrate, a stationary electrode provided above the substrate, a movable electrode that is provided to face the stationary electrode, a wall portion that is provided on the substrate and surrounds the movable electrode and the stationary electrode, a film member that is fixed to the wall portion and seals space including the movable electrode and the stationary electrode, and a support portion that is provided, on an inner side of the wall portion on the substrate, in addition to the movable electrode and the stationary electrode to support the film member from within the space.

8 Claims, 32 Drawing Sheets

ELECTRONIC DEVICE AND METHOD OF MANUFACTURING THE SAME

CROSS-REFERENCE TO RELATED APPLICATION

This application is based upon and claims the benefit of priority of the prior Japanese Patent Application No. 2009-123448, filed on May 21, 2009 and the prior Japanese Patent Application No. 2010-055045 filed on Mar. 11, 2010, the entire contents of which are incorporated herein by reference.

FIELD

The embodiments discussed herein are directed to an electronic device that may be structured as a so-called wafer-level package, and a method of manufacturing the same.

BACKGROUND

Conventionally, in order to respond to a demand for miniaturization and high-performance of high-frequency components (RF components) for use in mobile phones, developments of high frequency MEMS switches as high-frequency (RF) switches have been in progress by use of MEMS (Micro Electro Mechanical Systems) technology. The MEMS switches have, as features thereof, low loss, higher isolation, excellent distortion properties, and so on as compared with conventional semiconductor switches.

FIG. 29 is a cross sectional view illustrating a structure of a conventional MEMS switch 80j, and FIG. 30 is a plan view illustrating a functional portion KNj of the MEMS switch 80j. In FIG. 30, it should be noted that hatching is provided to non-cross sectional portions to clearly indicate a shape of each member.

In FIGS. 29 and 30, the MEMS switch 80j is formed of a substrate 81, a movable contact electrode 82 formed on the substrate 81, a stationary contact electrode 83, a movable driving electrode 84, a stationary driving electrode 85, a ground electrode 86, and so on. The movable contact electrode 82 and the movable driving electrode 84 are formed using an insulating material and integrally provided with a movable portion KB that constitutes a cantilever.

When a voltage is applied between the movable driving electrode 84 and the stationary driving electrode 85, electrostatic attraction is generated therebetween with which the movable driving electrode 84 is attracted and moved by the stationary driving electrode 85. In this way, the movable portion KB that is integrated with the movable driving electrode 84, and the movable contact electrode 82 move, and the movable contact electrode 82 touches the stationary contact electrode 83 so that the contacts close.

In FIG. 29, the functional portion KNj is turned upside down and housed in a package 87 made of ceramic which is filled with a nitrogen gas or the like, covered with a cap 88, and sealed. Each of the electrodes is provided with a bump BP and a terminal TB that utilizes a hole penetrating through the package 87. The MEMS switch 80j is mounted, for example, on an external printed board or the like using the terminal TB by soldering.

In this way, the functional portion KNj of the MEMS switch 80j is sealed by the package 87 and the cap 88 in a dry nitrogen atmosphere, which makes it possible to provide protection against breakage by an external force and secure stable opening and closing operation of the contacts.

A wafer level package structure is proposed as an example of a wafer level package (WLP). The structure includes a first substrate having functional elements and a second substrate that is bonded to seal each of the functional elements (Japanese Laid-open Patent Publication No. 2005-251898). According to the disclosure, the second substrate includes through holes that are arranged to face input and output electrodes, respectively, and first conductors filled into the through holes, whereby input and output terminals of each of the functional elements are arranged to include the through holes and the first conductors.

According to the conventional packaging method illustrated in FIG. 29, it is difficult to respond to a demand for miniaturization and a reduction in profile (low profile) because the package 87 made of ceramic which seals the functional portion KNj grows in size. It is also difficult to reduce the cost because the components of the package 87 made of ceramic and the sealing process require a fair amount of cost.

Such a device as the MEMS switch 80j having a movable portion requires a dicing process before the package 87 is sealed in the case where a wafer is used as the substrate 81 and a plurality of functional portions KNj are formed thereon. Accordingly, the movable portion may be damaged by a cutting fluid used for dicing or may be deformed by an action of surface tension of water during a drying process after the dicing process. To prevent this from being caused, conventionally, it is necessary to perform dicing with a sacrifice layer being left and chips after the dicing process are subjected to a process for removing the sacrifice layer, which leads to an increase in the number of processes and hence in cost.

In this respect, the packaging method proposed in Japanese Laid-open Patent Publication No. 2005-251898 does not cause such problems as damages and deformation of the movable portions in the dicing process because the dicing is performed while the first and second substrates are bonded together. However, since this method needs the second substrate that is thicker than the first substrate for sealing the functional elements provided on the first substrate, it still leaves a problem of reducing a profile (low profile) unsolved. In addition, an electrical loss in the penetration portion of wiring of the input and output terminals is not such a level to be ignored, and the issue of the cost still remains because the structures of the input and output terminals become complicated.

SUMMARY

According to an aspect of the invention, an electronic device includes a substrate, a movable electrode provided above the substrate, a stationary electrode that is provided to face the movable electrode, a wall portion that is provided on the substrate and surrounds the movable electrode and the stationary electrode, a film member that is fixed to the wall portion above the movable electrode and the stationary electrode, the film member sealing space including the movable electrode and the stationary electrode, and a support portion that is provided, on an inner side of the wall portion on the substrate, in addition to the movable electrode and the stationary electrode to support the film member from within the space.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Although various embodiments will be described below, the embodiments are examples, and the structures, shapes, dimensions, materials, and the like may be altered in various forms.

First Embodiment

Figure 2:
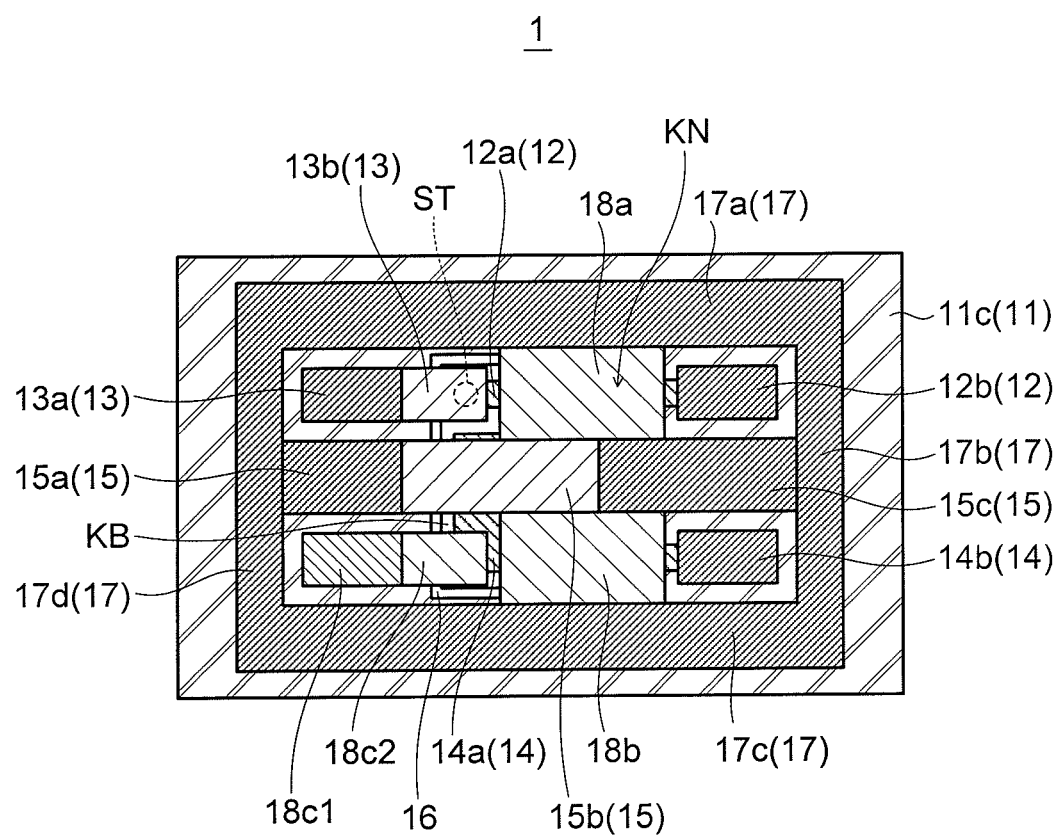
FIG. 2 is a front view of the MEMS switch illustrated in FIG. 1 while a film member is unillustrated.
Figure 3A:
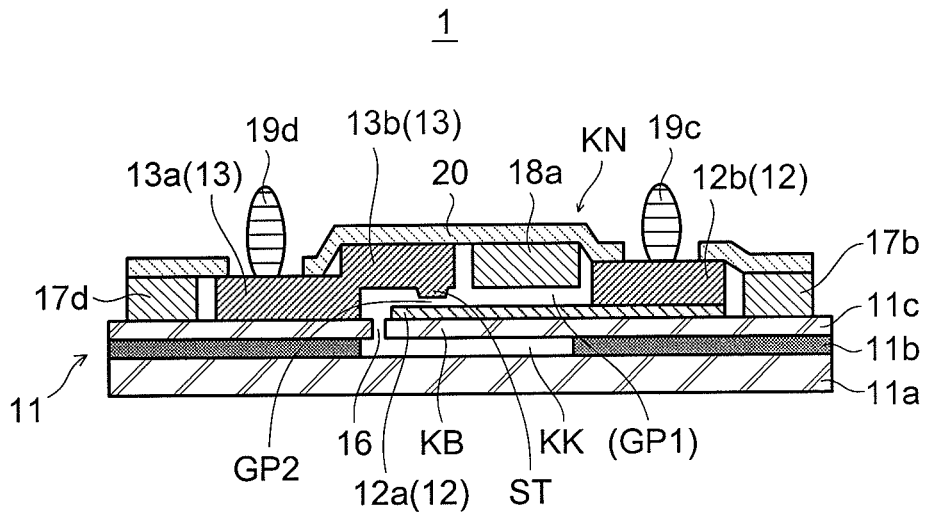
FIGS. 3A, 3B, and 3C are cross sectional views of the MEMS switch illustrated in FIG. 1.
Figure 3B:
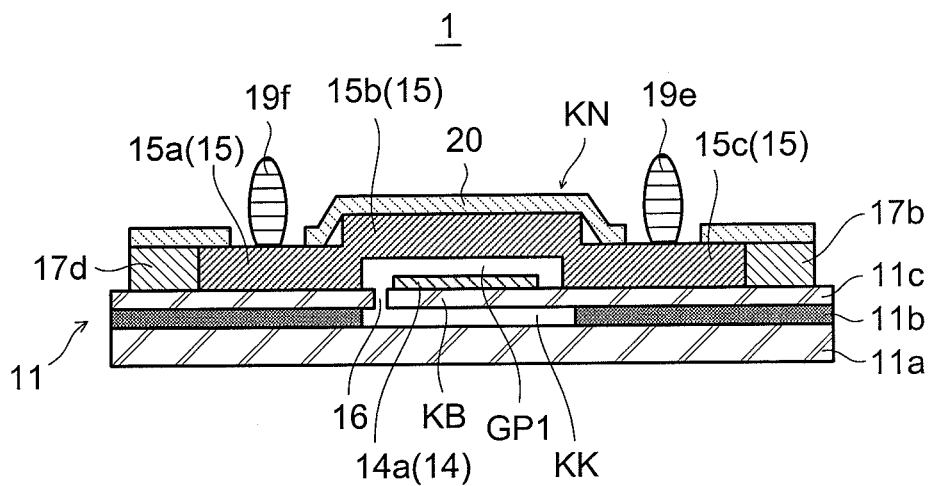
Figure 3C:
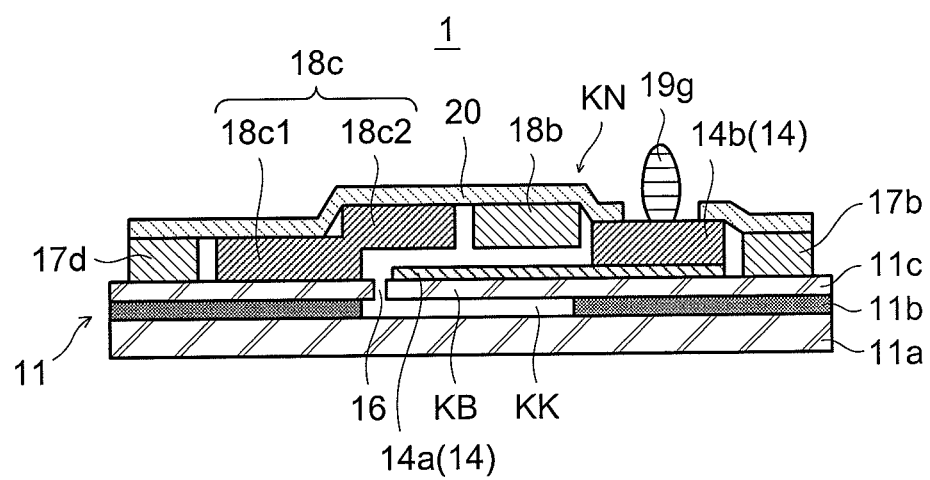
Figure 4:
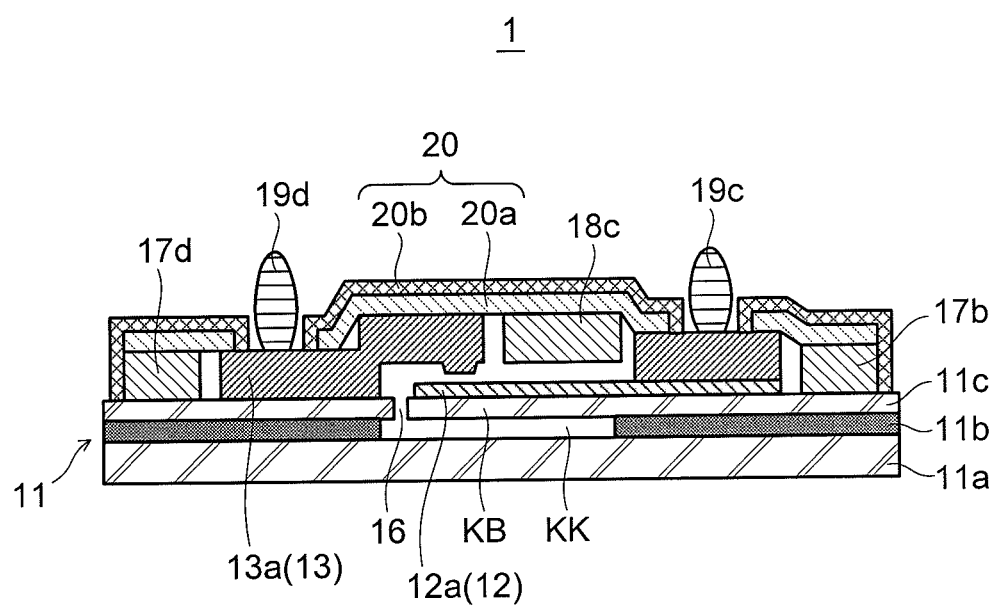
FIG. 4 is a cross sectional view of a variation of the MEMS switch according to the first embodiment.

First, with reference to FIGS. 1-4, a description will be given of a MEMS switch 1 according to the first embodiment. FIGS. 3A, 3B, and 3C are cross sectional views of the MEMS switch 1, taken along lines A-A, B-B, and C-C, illustrated in FIG. 1, respectively. FIG. 4 is a cross sectional view of the MEMS switch 1, taken along line A-A, illustrated in FIG. 1. In FIG. 2, a bump 19 and a film member 20 are not illustrated.

Referring to FIGS. 1-3A, the MEMS switch 1 is formed of a substrate 11, a movable contact electrode 12, a stationary contact electrode 13, a movable driving electrode 14, a stationary driving electrode 15, a wall portion 17, a support portion 18, a bump 19, a film member 20, and so on.

The substrate 11 is an SOI (Silicon On Insulator) substrate including three layers, namely, a support substrate 11a, an intermediate oxide film 11b, and an active layer 11c. The support substrate 11a is made of silicon and has a thickness of about 500 μm. The intermediate oxide film 11b is made of $SiO_2$ and has a thickness of about 4 μm. The active layer 11c is a silicon thin film and has a thickness of about 15 μm. A resistivity of the silicon of the SOI substrate is about 1000 Ωcm or larger.

The active layer 11c is provided with a slit 16 having a substantially horizontal U-shape in front view (plan view), which defines the movable portion KB. The intermediate oxide film 11b corresponding to a region including the movable portion KB is removed to provide space KK. As a result of this, the movable portion KB constitutes a cantilever having its fulcrum in a portion where the slit 16 is not provided. This arrangement allows an end edge portion opposite to the fulcrum to move upward and downward in FIGS. 3A-3C. Electrode portions 12a and 14a which will be described later are brought into close contact with and formed on a surface of the movable portion KB.

As illustrated in FIG. 3A, the movable contact electrode 12 includes a long slender electrode portion 12a formed in close contact with the movable portion KB, and an anchor portion 12b formed on one end of the electrode portion 12a.

The stationary contact electrode 13 is formed of an electrode base 13a formed in close contact with the active layer 11c, and a stationary contact portion 13b provided continuously to the electrode base 13a and in a facing manner above the electrode portion 12a. The stationary contact portion 13b is provided with a contact portion ST.

Contact that can be opened and closed is formed between the electrode portion 12a and the stationary contact portion 13b, and is closed when the movable portion KB deforms upward to thereby bring the electrode portion 12a into contact with the stationary contact portion 13b. A signal line SL is constituted by the movable contact electrode 12 and the stationary contact electrode 13, and a high-frequency signal passes through the signal line SL when the contact closes.

As illustrated in FIG. 3C, the movable driving electrode 14 is formed of an electrode portion 14a including an elongated portion that is formed in close contact with the movable portion KB and a rectangular portion formed continuously on a tip end of the elongated portion, and the anchor portion 14b formed on one end of the electrode portion 14a.

As illustrated in FIG. 3B, the stationary driving electrode 15 is formed of electrode bases 15a and 15c that are formed in close contact with the active layer 11c, and an electrode opposing portion 15b that is supported by the electrode bases 15a and 15c and forms a bridge straddling over the movable portion KB. The electrode opposing portion 15b faces the rectangular portion of the electrode portion 14a thereabove.

These anchor portions 12b and 14b, and the electrode bases 13a, 15a, and 15c, per se, all have the same height (thickness). The stationary contact portion 13b and the electrode opposing portion 15b have the same height level at their respective top surfaces. In addition, the stationary driving electrode 15 is provided in parallel to the signal line SL.

A metallic material, for example, gold is used as a material of the movable contact electrode 12, the stationary contact electrode 13, the movable driving electrode 14, and the stationary driving electrode 15.

The wall portion 17 is formed, on the substrate 11, in a rectangular frame shape so as to surround the movable contact electrode 12, the stationary contact electrode 13, the movable driving electrode 14, the stationary driving electrode 15, and the like. To be specific, the wall portion 17 is formed of four side portions 17a-17d. The four side portions 17a-17d all have the same height (thickness) which is also identical with that of the anchor portions 12b and 14b, the electrode base 13a, and the electrode bases 15a and 15c. The side portion 17b is integrally linked with the electrode base 15c, and the side portion 17d is linked with the electrode base 15a.

The support portions 18a, 18b, and 18c are provided within an area surrounded by the wall portion 17. The support portion 18c is formed of a support base 18c1 provided in close contact with the substrate 11, and a support body portion 18c2 which continuously extends to the support base 18c1.

The support portions 18a and 18c are formed in substantially symmetrical shapes and positions with the stationary driving electrode 15 serving as an axis of symmetry. The support portion 18c and the stationary contact electrode 13 are formed in substantially symmetrical shapes and positions with the stationary driving electrode 15 serving as an axis of symmetry.

Gaps between the stationary contact portion 13b and the electrode opposing portion 15b, the stationary contact portion 13b and the support portion 18a, the support body portion 18c2 and the electrode opposing portion 15b, and the support body portion 18c2 and the support portion 18b are all arranged to be about 100 μm or smaller, preferably about 50 μm or smaller.

The wall portion 17, and the support portions 18a and 18b are all integrally and continuously formed of the same metallic material, for example, gold. In other words, the support portion 18a has one side face thereof making contact and linked with the side portion 17a and the other side face thereof making contact and linked with the electrode opposing portion 15b. The support portion 18b has one side face thereof making contact and linked with the electrode opposing portion 15b and the other side face thereof making contact and linked with the side portion 17c.

The support portion 18a, the support portion 18b, and the support body portion 18c2 all have the same height level at their respective top surfaces, and also have the same height level as the electrode opposing portion 15b at their respective top surfaces. Hereinafter, a part or whole of these support portions 18a, 18b, and 18c may be referred to as "support portion 18".

The support portion 18 is provided in addition to the movable contact electrode 12, the stationary contact electrode 13, the movable driving electrode 14, and the stationary driving electrode 15 to support the film member 20 from within the space provided therebelow. To state it differently, the support portion 18 is something different from the movable contact electrode 12, the stationary contact electrode 13, the movable driving electrode 14, and the stationary driving electrode 15, and has no direct links with the functions thereof.

The film member 20 is disposed to cover the movable contact electrode 12, the stationary contact electrode 13, the movable driving electrode 14, and the stationary driving electrode 15 thereabove, and has an edge portion thereof intimately fixed to a top surface of the wall portion 17 by welding (fusion bonding) or adhesion. In other words, the film member 20 seals the space containing therein the movable contact electrode 12, the stationary contact electrode 13, the movable driving electrode 14, and the stationary driving electrode 15, i.e., space enclosed by the wall portion 17, so that the space is not exposed outside. The thickness of the film member 20 is, for example, about 20-50 μm.

The film member 20 is also fixed to the top faces of the stationary contact portion 13b, the support portion 18a, the electrode opposing portion 15b, the support portion 18 b, and the support body portion 18c2 by welding or adhesion. In order to fix the film member 20 by welding, the film member 20 may be pressed against the electrodes or the support portion 18 predetermined pressure and high temperature.

A film having heat resistance and insulation properties is used as a material for the film member 20. For example, a material such as a liquid crystal polymer is used. A material having moisture-proof properties is preferable. However, if the moisture-proof properties are not sufficient, a double-film structure is adopted by using a material having high moisture-proof properties.

For example, as illustrated in FIG. 4, a double-film structure formed of a sealing film 20a and a protective film 20b is used as the film member 20. A photoresist, polyimide, or the like is used as the sealing film 20a. It is also possible to use photosensitive polyimide. A material such as silicon dioxide ($SiO_2$) is used for the protective film 20b. The protective film 20b covers an end edge of the sealing film 20a and a side surface of the wall portion 17 also. The protective film 20b has a thickness of about 5 μm. The inside of the MEMS switch 1 is sealed by the sealing film 20a which provides a mechanical strength as a sealing film. The protective film 20b provides sufficient moisture-proof properties.

The film member 20 is provided with a plurality of holes by laser for wiring, and a plurality of bumps 19 are individually provided in the plurality of holes. To be more specific, the film member 20 is provided with the holes in positions corresponding to top surfaces of the two end portions of the side portion 17a, the electrode base 13a, the electrode bases 15a and 15c, and the anchor portions 12b and 14b. The bumps 19a-19g are provided in these holes.

The bumps 19a-19g are formed of a metallic material, for example, gold so as to have a maximum diameter of, for example, about 60 μm and a length of, for example, about 100 μm. The bumps 19a-19g are fixed to the upper surfaces of the side portion 17a, the electrode base 13a, the electrode bases 15a and 15c, and the anchor portions 12b and 14b by ultrasonic welding or fusion bonding.

The wall portion 17 and portions that are electrically connected to the wall portion 17 are connected to the ground potential. As a result, the support portions 18a and 18b are connected to the ground potential via the wall portion 17. The support portion 18c is also connected to the ground potential.

In the MEMS switch 1 according to the embodiment described above, the functional portion KN formed of the movable contact electrode 12, the stationary contact electrode 13, the movable driving electrode 14, the stationary driving electrode 15, and the like which are formed on the substrate 11 are surrounded by the wall portion 17, and covered and sealed by the film member 20, which thereby provides a packaging structure. The height levels of the wall portion 17 and the support portion 18 are substantially the same as that of the functional portion KN such as the stationary contact electrode 13, and the film material 20 is simply placed thereon. With this arrangement, the size in the direction of height does not increase substantially, which makes it possible to realize a reduction in profile. It is possible to arrange the height of the MEMS switch 1, for example, at about 400 μm. It is also possible to reduce the length and the width, i.e., a bottom area, of the MEMS switch 1, leading to the miniaturization of the device.

Furthermore, since the packaging structure is achieved by forming the wall portion 17 and the support portion 18, and providing the film member 20, it is possible to prevent the manufacturing process from becoming complicated and reduce the cost. It is also possible to form the wall portion 17 and the support portion 18 simultaneously with the movable contact electrode 12 and the stationary contact electrode 13. This contributes to simplifying the manufacturing process.

It is also possible to manufacture the MEMS switch 1 by using a wafer as the substrate 11, forming a plurality of MEMS switches 1 on the wafer, and thereafter dicing the wafer into individual MEMS switches 1.

To be specific, the movable contact electrodes 12, the stationary contact electrodes 13, the movable driving electrodes 14, the stationary driving electrodes 15, the support portions 18, and the like which correspond to the plurality of MEMS switches 1 are first formed on a single wafer, and thereafter the wall portions 17 corresponding to the overall devices are formed on the wafer in a form of matrix cells, the film member 20 is bonded thereon in a manner to cover the entire wafer, and then the bumps 19 are provided. In this way, since a plurality of MEMS switches 1 are formed on a single wafer, the wafer is diced along the wall portions 17.

With this arrangement, it becomes possible to arrange the MEMS switches 1 in a wafer level packaging structure and greatly simplify the process required for packaging. By the time the dicing is performed, the packaging has been already completed and the functional portions KN have been sealed by the film member 20. Therefore, the functional portions KN can be prevented from being damaged or deformed by the cutting fluid.

Additionally, since the film member 20 serving for packaging is supported by the movable contact electrodes 12, the stationary contact electrodes 13, the movable driving electrodes 14, the stationary driving electrodes 15, the wall portions 17, the support portions 18, and so on, the film member 20 is not deformed or damaged when the dicing is performed or the device is used.

The film member 20 is fixed to those portions that are fixed to the substrate 11 and therefore does not obstruct the operation of the movable portion KB. At the same time, the support portion 18 keeps an appropriate gap between it and the movable portion KB and therefore never interferes the operation of the movable portion KB.

In the MEMS switch 1, the signal line SL constituted by the movable contact electrode 12 and the stationary contact electrode 13 forms a coplanar structure (CPW) together with the side portion 17a of the wall portion 17 and the stationary driving electrode 15. Therefore, the wall portion 17 is not only used for sealing but also used effectively for this purpose. This arrangement contributes to further miniaturization of the device.

Next, a description will be given of a method of manufacturing the MEMS switch 1 with reference to FIGS. 5A-10. The cross sectional views illustrated in FIGS. 5B, 6B, 7, and 8B are all taken along line A-A in FIG. 1.

Figure 9:
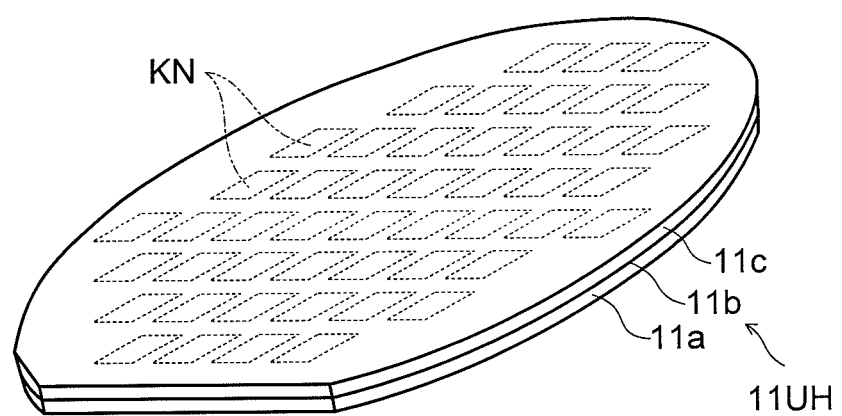
FIG. 9 is a diagram illustrating an example of a wafer substrate.

First, in this embodiment, a substrate 11UH of an SOI wafer illustrated in FIG. 9 is prepared. As described with reference to FIG. 3, the substrate 11UH is formed of the support substrate 11a, the intermediate oxide film 11b, and the active layer 11c. A plurality of functional portions KN are formed on the substrate 11UH of the wafer, the wall portion 17 and the film member 20 are formed, and thereafter dicing is performed to complete the MEMS switches 1. Hereinafter, a description will be given of only a portion corresponding to a single MEMS switch 1.

In FIG. 5, a film of chrome is formed to have a thickness of about 50 nm as a close-contact layer, and subsequently a film of gold is formed to have a thickness of about 500 nm on a surface of the active layer 11c by sputtering. Then, these are processed by photolithography and ion milling to simultaneously form the electrode portion 12a of the movable contact electrode 12 and the electrode portion 14a of the movable driving electrode 14.

Next, two slits 16 having small and large horizontal U-shapes and having widths of about 2 μm, respectively, are worked in the perimeter of the electrode portions 12a and 14a by Deep-RIE (Reactive Ion Etching) to thereby form a portion of a cantilever. Then, this is followed by a formation of a sacrifice layer 31 by forming a film of silicon dioxide ($SiO_2$) of about 5 μm in thickness by plasma CVD (Chemical Vacuum Deposition) method.

Subsequently, the sacrifice layer 31 is etched by photolithography and RIE. During this process, the sacrifice layer 31 is half-etched to a desired depth for the contact portion ST and an actuator portion, whereas the sacrifice layer 31 is completely removed for the portions corresponding to the anchor portions 12b and 14b, the electrode bases 13a, 15a, and 15c, and the like. The sacrifice layer 31 is also completely removed for the portions corresponding to the support base 18c1 and the wall portion 17.

Then, a seed layer required for plating is formed by sputtering. The seed layer is formed of an under layer of molybdenum having a thickness of about 50 nm and an upper layer of gold having a thickness of about 300 nm. Next, a gold plating film having a thickness of about 20 μm is formed by plating method.

Figure 6A:
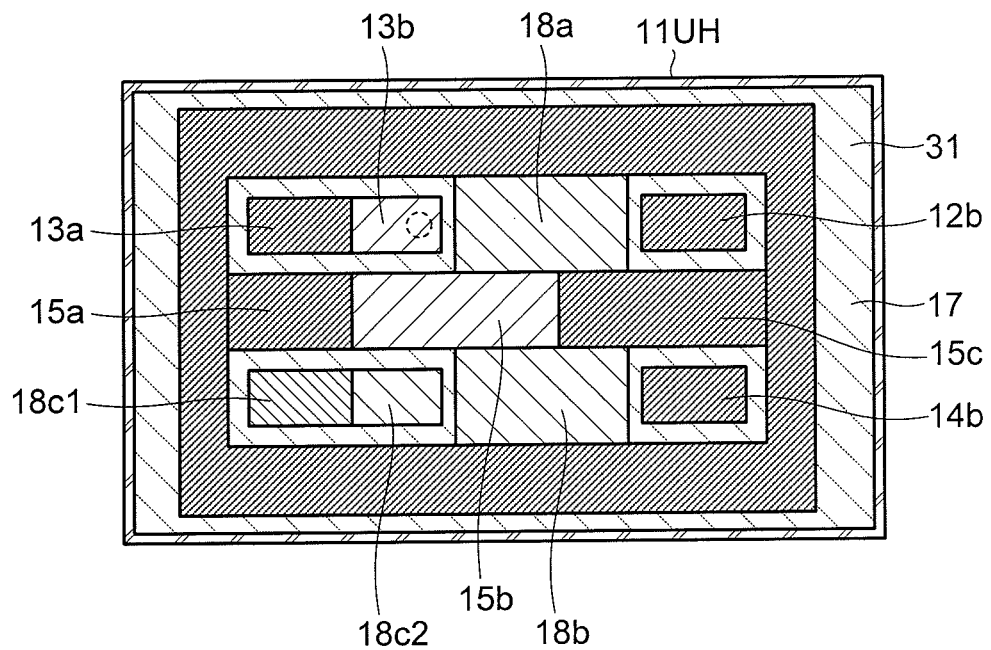
FIGS. 6A and 6B are front and cross sectional views, respectively, of the MEMS switch for describing an example of a manufacturing process.
Figure 6B:
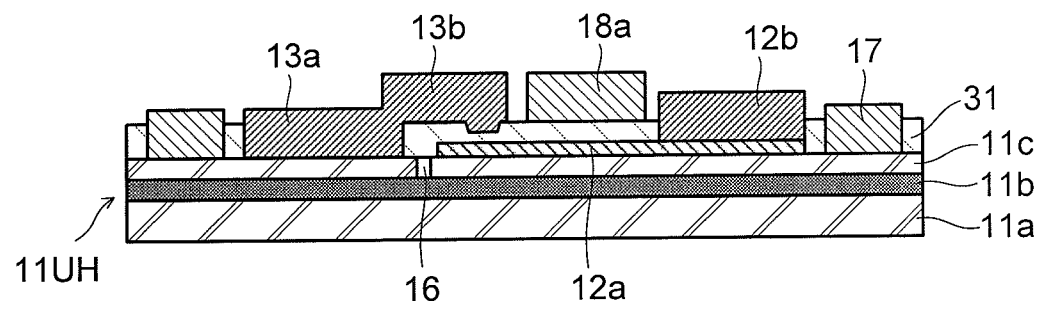

By these processes, as illustrated in FIGS. 6A and 6B, the anchor portion 12b of the movable contact electrode 12, the stationary contact electrode 13, the anchor portion 14b of the movable driving electrode 14, the stationary driving electrode 15, the support portion 18, and the wall portion 17 are simultaneously formed. These are formed by plating and therefore have the same thickness. During these processes, gaps (distances) in front view (plan view) between individual portions are arranged to be about 50 μm or smaller.

Half-etching of the sacrifice layer 31 is not performed on the cantilever, but the stationary driving electrode 15 is formed in a bridge shape. The support portions 18a, 18b, and 18c are also formed similarly in a bridge shape. This means that an air gap (gap) GP1 formed between the stationary driving electrode 15 and the electrode portion 14a of the movable driving electrode 14 is wider than an air gap GP2 between the electrode portion 12a of the movable contact electrode 12 and the contact portion ST. For example, the air gap GP1 is about twice as large as the air gap GP2. Therefore, it is possible to ignore the influence exerted on the operation by a voltage applied to the electrode portion 14a of the movable driving electrode 14 for driving the cantilever.

Figure 7:
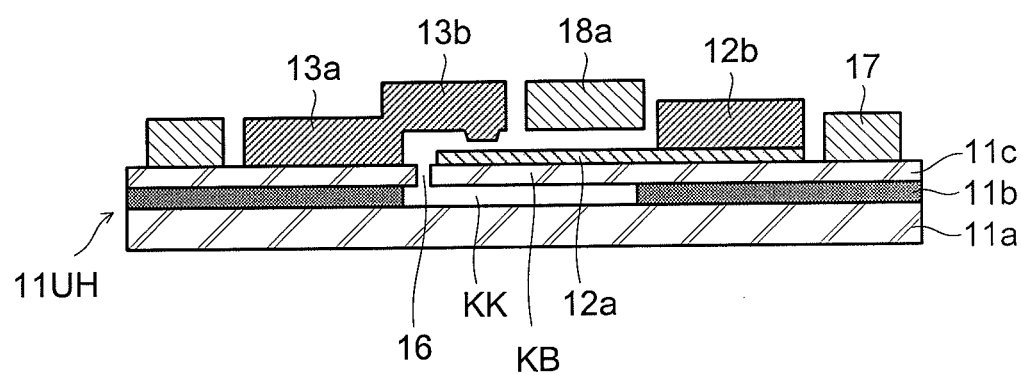
FIG. 7 is a cross sectional view of the MEMS switch for describing an example of a manufacturing process.

Next, as illustrated in FIG. 7, parts of the seed layer that are not covered by plating are removed by ion milling and RIE. Then, the sacrifice layer 31 and the intermediate oxide film 11b under the cantilever are removed by etching using hydrofluoric acid to thereby form the space KK. Here, the front view corresponding to FIG. 7 is almost the same as that illustrated in FIG. 2. In addition, molybdenum of the under layer of the seed layer which is exposed on the surface of the contact portion ST protruding from the stationary contact electrode 13 is removed by wet etching. The manufacturing processes described hitherto may be arranged in a similar way as the conventional processes except that the plating pattern is different.

Figure 8A:
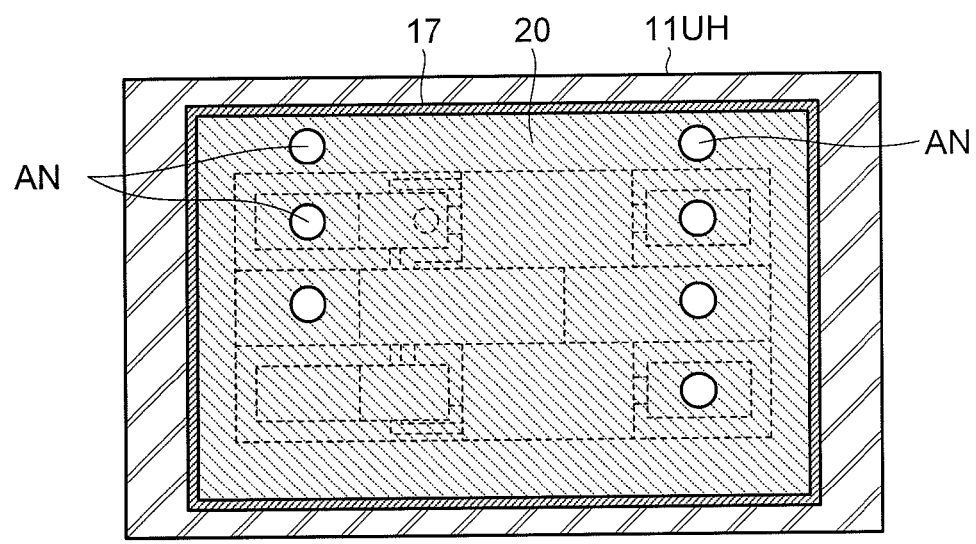
FIGS. 8A and 8B are front and cross sectional views, respectively, of the MEMS switch for describing an example of a manufacturing process.
Figure 8B:
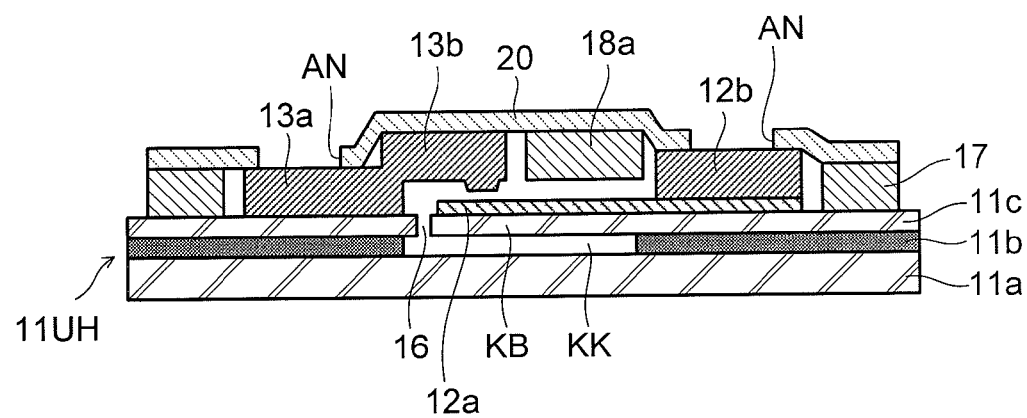

Then, as illustrated in FIGS. 8A and 8B, the film member 20 in a film shape is bonded to an entire area of the substrate 11UH. This means that, by forming a flexible film of the film member 20 that is fixed to the top surface of the wall portion 17, the functional portion KN including a plurality of structures is covered by the flexible film. As a material for the film member 20, a material such as a liquid crystal polymer as described above is used.

Figure 10:
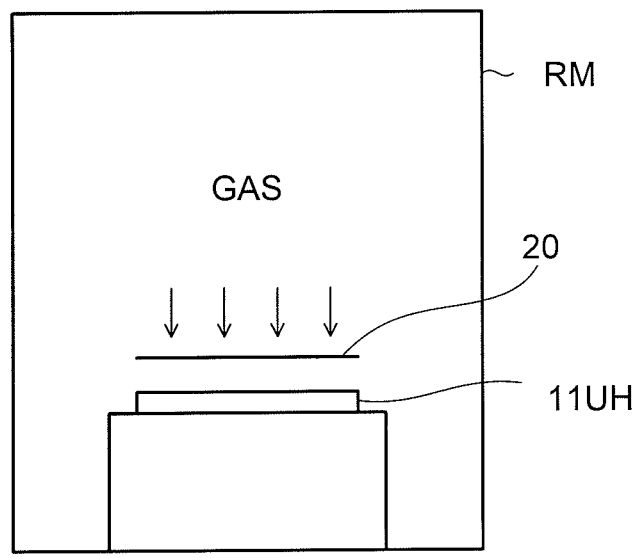
FIG. 10 is a diagram depicting an example of a process for bonding a film member to a functional portion of the wafer substrate.

As illustrated in FIG. 10, the substrate 11UH having the functional portion KN formed thereon is put into a chamber RM, the film member 20 is placed on the top surface of the substrate 11UH, and the film member 20 is pressed against the substrate 11UH by applying a predetermined high temperature and a predetermined pressure. Through this process, the film member 20 is welded to the top surfaces of the anchor portions 12b and 14b, the stationary contact electrode 13, the stationary driving electrode 15, the support portions 18a-18c, and the wall portion 17.

In the space enclosed by the wall portion 17, since gaps provided on the surfaces of the stationary contact electrode 13, the movable contact electrode 12, the stationary driving electrode 15, and the like are filled by the support portion 18 at short intervals, the film member 20 hardly deflects when it is bonded. For this reason, the film member 20 by its deflection never touches the movable contact electrode 12 or the like, and therefore space required for the operation of the cantilever is secured. It should be noted that, although the film member 20 is illustrated in FIGS. 8A and 8B so as to fit within a surface area of the wall portion 17, the film member 20 is actually provided over an entire area of the substrate 11UH. Holes AN for the bumps 19 are provided in the film member 20 by laser beam machining.

When a permanent resist or photosensitive polyimide is used as the film member 20, the holes AN can be provided by photolithography and easily worked. In this case, however, these materials are poor in moisture cut-off properties. Therefore, another film member 20b may be provided to make double films.

Figure 1:
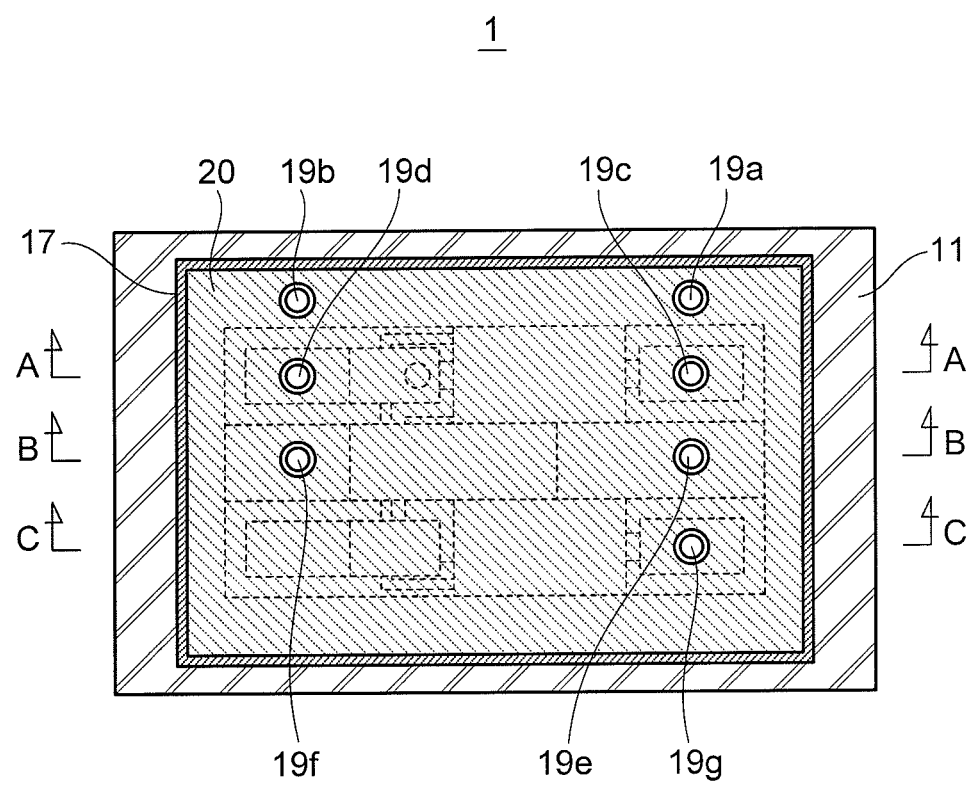
FIG. 1 is a front view of a MEMS switch according to the first embodiment.

Thereafter, as illustrated in FIG. 1, the plurality of bumps 19a-19g are fitted by welding in the holes AN.

Finally, the substrate 11UH is diced along the borders between the wall portions 17 of individual functional portions KN to thereby complete the MEMS switch 1. In other words, the film member 20, the wall portions 17, and the substrate 11UH are cut along individual wall portions 17, and each structure is segmented as the MEMS switch 1. In the MEMS switch 1, since the movable portion KB is protected by the wall portion 17 and the film member 20, the MEMS switch 1, as is, can be mounted on a printed board or the like.

In this way, according to this embodiment, it is possible to realize a wafer level package with a minimum number of processes by using the wall portions 17 and the support portions 18 as bases for the film member 20, and realize miniaturization, a reduction in profile, and a reduction in loss.

In this embodiment, the movable contact electrode 12 and the movable driving electrode 14 are examples of a movable electrode, and the stationary contact electrode 13 and the stationary driving electrode 15 are examples of a stationary electrode.

Second Embodiment

Next, a description will be given of a MEMS switch 1B according to the second embodiment. In the second embodiment, only those portions that are different from the first embodiment will be described. Portions that are same as those in the first embodiment are identified with the identical reference symbols, and the description thereof will not be repeated or will be simplified. This also applies to the other embodiments.

Figure 11:
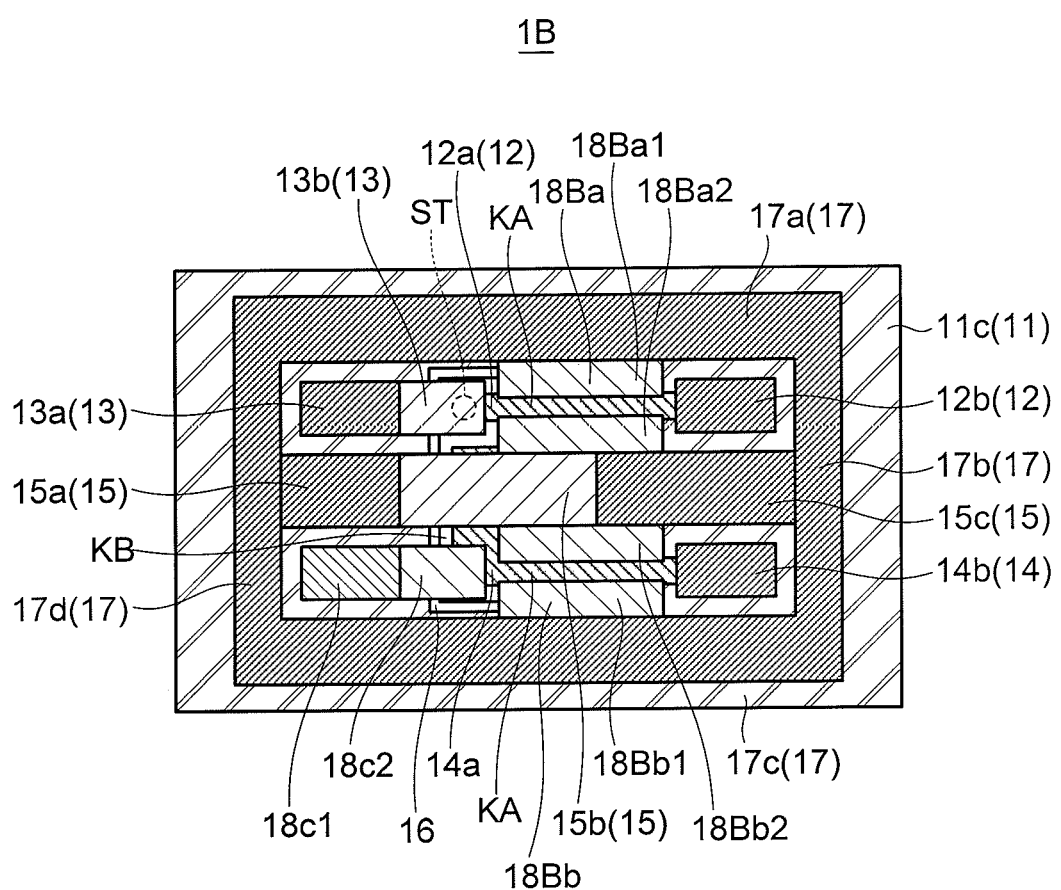
FIG. 11 is a front view of a MEMS switch according to the second embodiment.

FIG. 11 is a front view of the MEMS switch 1B according to the second embodiment. In FIG. 11, the MEMS switch 1B is illustrated while the film member is omitted.

In FIG. 11, support portions 18Ba and 18Bb have opening portions KA which open above the electrode portions 12a and 14a, respectively. Specifically, the support portion 18Ba includes support portion segments 18Ba1 and 18Ba2, and the support portion 18Bb includes support portion segments 18Bb1 and 18Bb2. The support portion segment 18Ba1 is linked with the side portion 17a, the support portion segments 18Ba2 and 18Bb2 are linked with the stationary driving electrode 15, and the support portion segment 18Bb1 is linked with the side portion 17c.

This arrangement makes the electrode portion 12a of the movable contact electrode 12 and the electrode portion 14a of the movable driving electrode 14 face the film member 20 through each of the opening portions KA.

Stray capacitances of the electrode portions 12a and 14a are reduced by providing the opening portions KA. Therefore, the high-frequency properties are improved. Here, the width of the opening portions KA may be set at substantially the same as the widths of the electrode portions 12a and 14a.

Third Embodiment

Next, a description will be given of a MEMS switch 1C according to the third embodiment.

Figure 12:
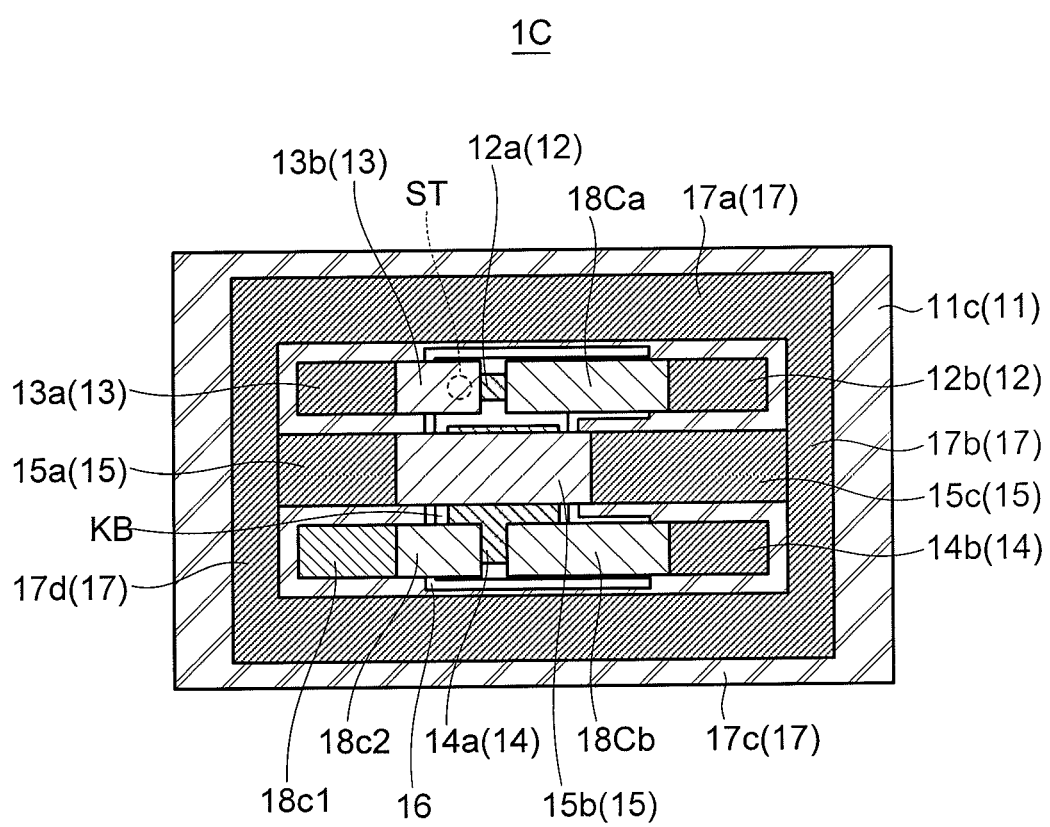
FIG. 12 is a front view of a MEMS switch according to the third embodiment.

In FIG. 12, a support portion 18Ca is provided so as to be linked with the anchor portion 12, a support portion 18Cb is provided so as to be linked with the anchor portion 14b. As a result, the support portions 18Ca and 18Cb are made in such shapes to extend from the signal line. With this arrangement, the support portions 18Ca and 18Cb, without being connected to the ground potential, acquire the same potential that is applied to the movable contact electrode 12 or the movable driving electrode 14.

In the MEMS switch 1C according to the third embodiment, stray capacitances of the electrode portions 12a and 14a are also reduced, and the high-frequency properties are improved.

Fourth Embodiment

Next, a description will be given of a MEMS switch 1D according to the fourth embodiment.

Figure 13:
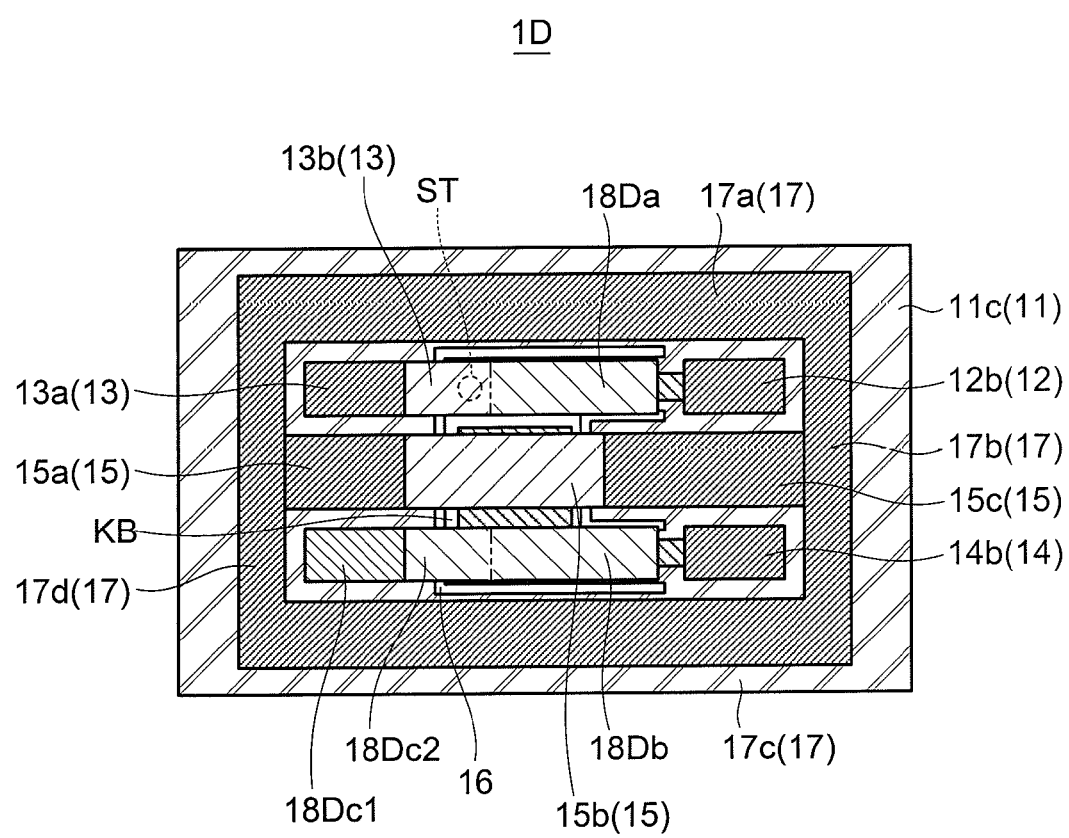
FIG. 13 is a front view of a MEMS switch according to the fourth embodiment.

In FIG. 13, a support portion 18Da is provided in a manner to be extended from a front end of the stationary contact portion 13b. A support portion 18Dc, as in the case of the support portion 18c in the first embodiment, has a support base 18Dc1 and a support body portion 18Dc2. A support portion 18Db is provided in a manner to be extended to a front end of the support body portion 18Dc2.

With this arrangement, the support portions 18Da and 18Db, without being connected to the ground potential, acquire the same potential that is applied to the movable contact electrode 12 or the support portion 18Dc.

In the MEMS switch 1D according to the fourth embodiment, stray capacitances of the electrode portions 12a and 14a are also reduced, and the high-frequency properties are improved.

Fifth Embodiment

Next, with reference to FIGS. 14-20B, a description will be given of a MEMS variable capacitor 1E according to the fifth embodiment. The MEMS variable capacitor 1E is a variable capacitor having a thin membrane structure. In the description, portions having similar functions as in the case of MEMS switch 1 in the first embodiment are identified with identical reference symbols or reference symbols with "E" added thereto, and corresponding descriptions will not be repeated or will be simplified.

Figure 14:
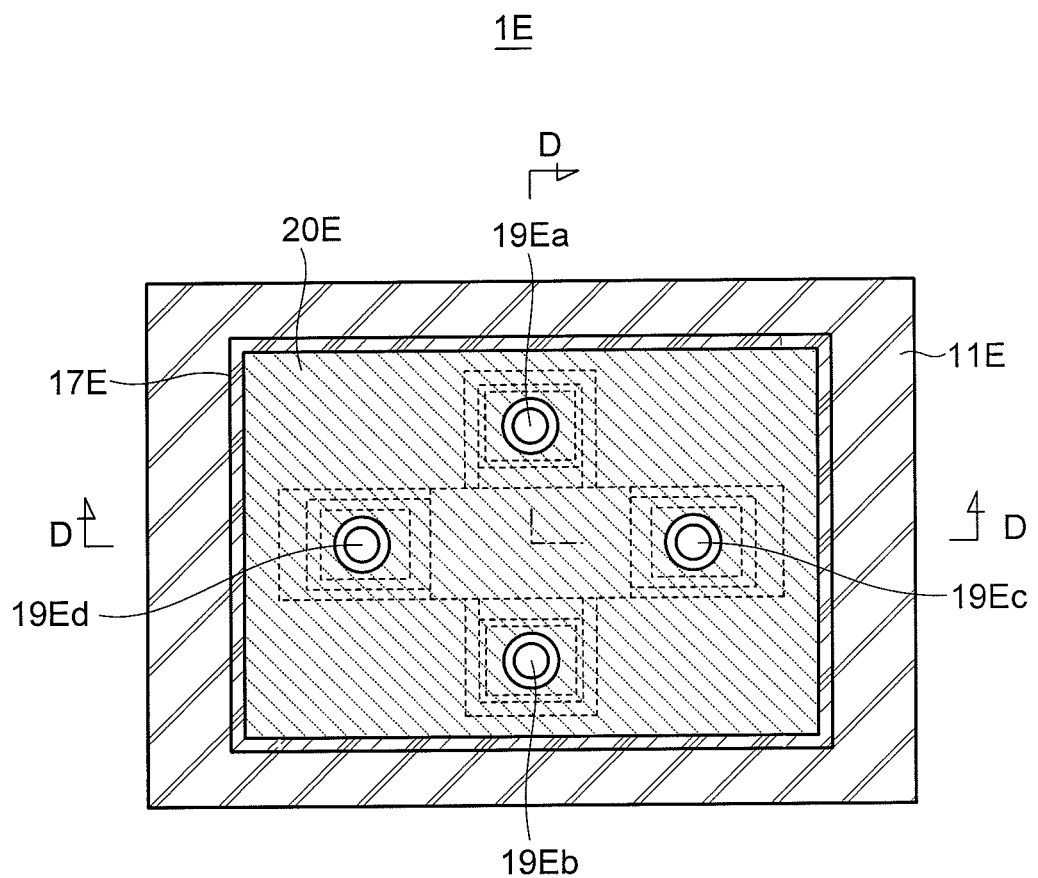
FIG. 14 is a front view of a MEMS variable capacitor according to the fifth embodiment.
Figure 16:
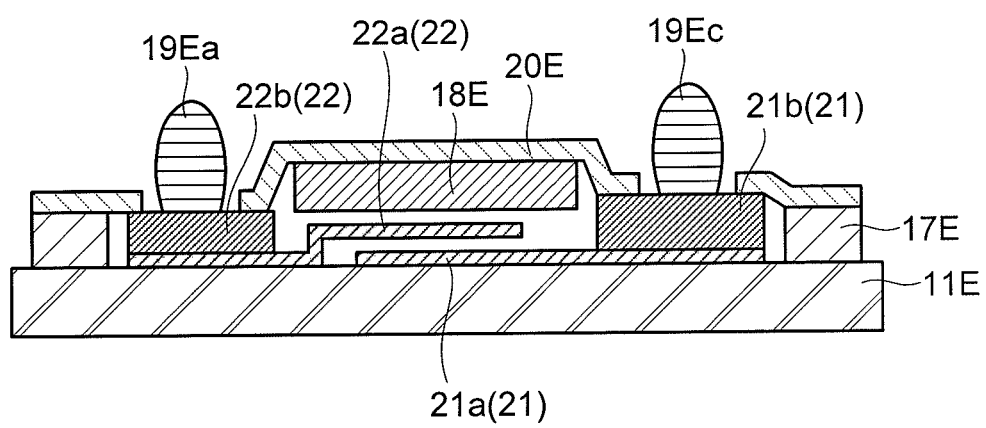
FIG. 16 is a cross sectional view of the MEMS variable capacitor taken along line D-D in FIG. 14.

FIG. 16 is a cross sectional view of the MEMS variable capacitor 1E taken along line D-D indicated in FIG. 14. To be specific, FIG. 16 is a revolved sectional view, including a portion taken along a line starting from "D" indicated in the upper side of FIG. 14 and ending at a center point, and a portion starting from the center point and ending at "D" indicated in the right side of FIG. 14. FIGS. 17B, 18B, 19B, and 20B are also revolved sectional views taken along the same lines.

Figure 15:
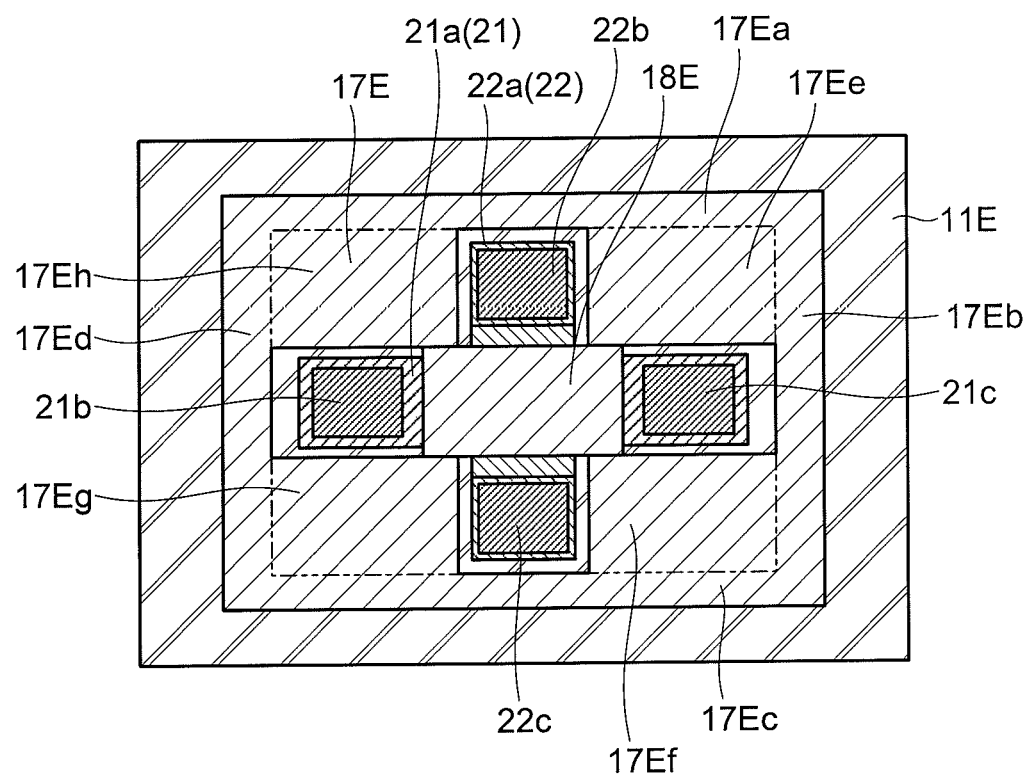
FIG. 15 is a front view of the MEMS variable capacitor illustrated in FIG. 14 while a film member is unillustrated.

In FIGS. 14-16, the MEMS variable capacitor 1E is formed of a substrate 11E, a lower electrode 21, an upper electrode 22, a wall portion 17E, support portion 18E, a bump 19E, a film member 20E, and so on.

The MEMS variable capacitor 1E is provided with the lower electrode 21 and the upper electrode 22 placed on a glass substrate 11E. According to the electrostatic attraction generated by a voltage applied between the lower electrode 21 and the upper electrode 22, the capacitance therebetween is varied.

The lower electrode 21 includes an electrode portion 21a having a rectangular shape in front view (plan view), and anchor portions 21b and 21c formed on both ends of the electrode portion 21a. The upper electrode 22 has a bridge shape straddling over the lower electrode 21, and includes an electrode portion 22a having a rectangular shape in front view and anchor portions 22b and 22c formed on both ends of the electrode portion 22a. A metallic material such as gold is used as a material for the lower electrode 21 and the upper electrode 22.

The wall portion 17E is provided on the substrate 11E to surround the lower electrode 21 and the upper electrode 22, and cover almost an entire area within the surrounded area excluding the lower electrode 21 and the upper electrode 22.

This means that the wall portion 17E is integrally formed of four side portions 17Ea-17Ed, and support wall portions 17Ee-17Eh disposed in the corners surrounded by these side portions 17Ea-17Ed, while all of these portions have the same height (thickness).

The wall portion 17E has the same height (thickness) as those of the anchor portions 21b, 21c, 22b, and 22c.

The support portion 18E has a rectangular shape in front view, is taller than the wall portion 17E, and is formed by being continuously linked with corners of individual support wall portions 17Ee-17Eh of the wall portion 17E.

The film member 20E is placed above the lower electrode 21, the upper electrode 22, and the support portion 18E so as to cover these components. An edge portion of the film member 20E is made close contact with and fixed to the top surface at a position close to an outer periphery thereof by welding (fusion bonding), adhesion, or the like. Resultantly, the film member 20E seals the space of the functional portion KN including the lower electrode 21 and the upper electrode 22 off the outside environment. The thickness of the film member 20E is, for example, about 20-50 μm.

The film member 20E is fixed to the top surfaces of the support wall portions 17Ee-17Eh of the wall portion 17E by welding, adhesion, or the like.

The film member 20E is provided with holes in positions corresponding to the anchor portions 21b, 21c, 22b, and 22c, and the bumps 19Ea-19Ed are provided in the holes. The bumps 19Ea-19Ed are formed of a metallic material, for example, gold, and fixed to the anchor portions 21b, 21c, 22b, and 22c by welding or fusion bonding.

In the MEMS variable capacitor 1E according to the fifth embodiment, the functional portion KN including the lower electrode 21 and the upper electrode 22 which are formed on the substrate 11E is surrounded by the wall portion 17E, and covered and sealed by the film member 20E to thereby form a packaging structure.

The wall portion 17E is simply provided on the substrate 11E and is simply covered by the film member 20E. With this arrangement, the size in the direction of height does not increase substantially, which makes it possible to realize a reduction in profile. It is also possible to reduce the length and the width, i.e., a bottom area, of the MEMS variable capacitor 1E, leading to the miniaturization of the device.

In addition, since the packaging structure is achieved by forming the wall portion 17E and the support portion 18E, and providing the film member 20E, it is possible to prevent the manufacturing process from becoming complicated and reduce the cost. It is also possible to form the wall portion 17E and the support portion 18E simultaneously with the anchor portions 21b, 21c, 22b, and 22c of the lower electrode 21 and the upper electrode 22. This contributes to simplifying the manufacturing process.

It is also possible to manufacture the MEMS variable capacitor 1E by using a wafer as the substrate 11E, forming a plurality of MEMS variable capacitors 1E on the wafer, and thereafter dicing the wafer into individual MEMS variable capacitors 1E. This makes it possible to manufacture the MEMS variable capacitor 15 at a lower cost.

Next, referring to FIGS. 17A-20B, a description will be given of a method of manufacturing the MEMS variable capacitor 1E.

Figure 17A:
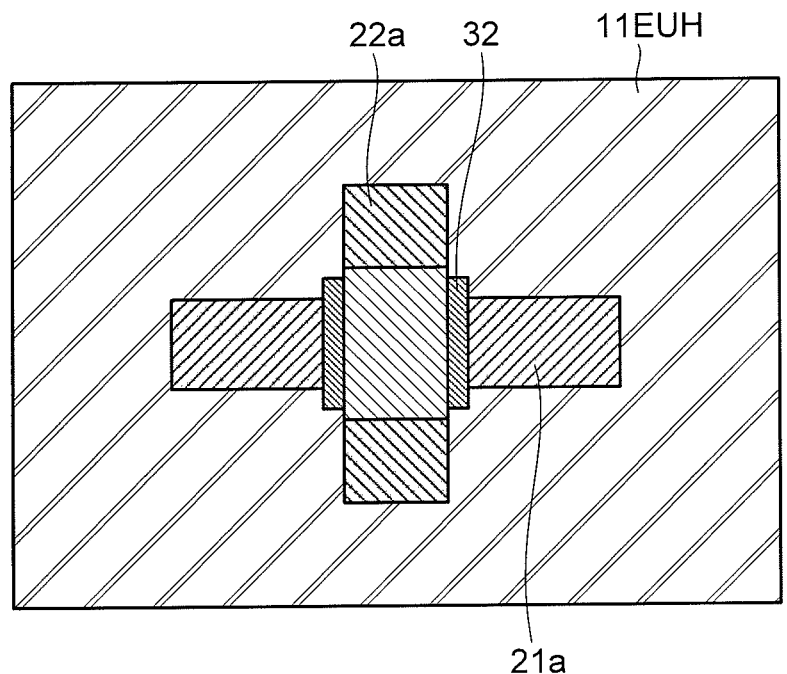
FIGS. 17A and 17B are front and cross sectional views, respectively, of the MEMS variable capacitor for describing an example of a manufacturing process.
Figure 17B:
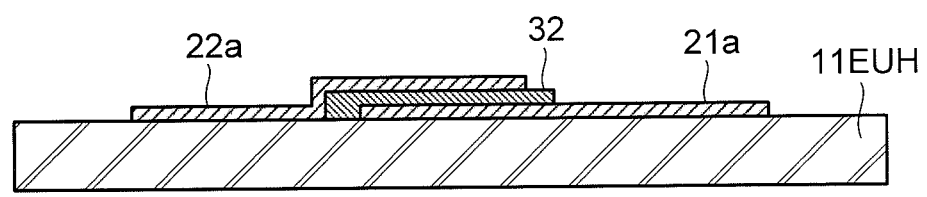
Figure 18A:
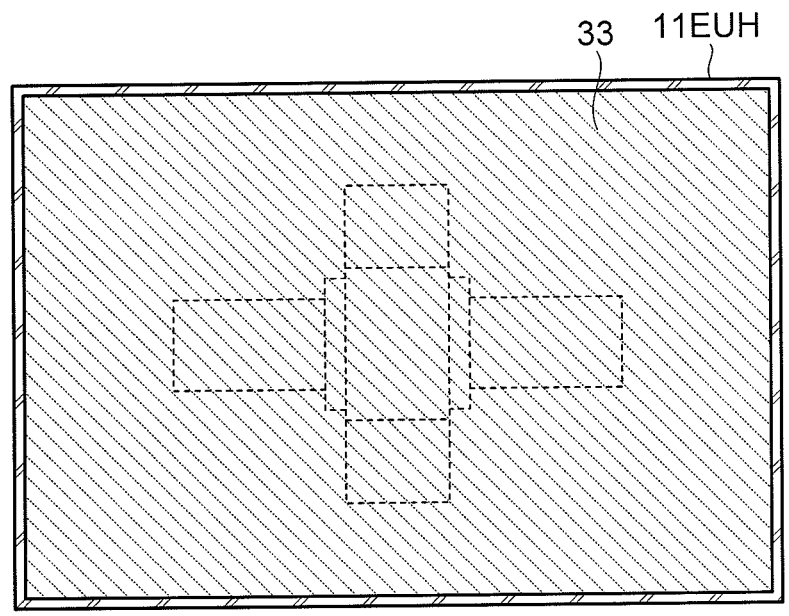
FIGS. 18A and 18B are front and cross sectional views, respectively, of the MEMS variable capacitor for describing an example of a manufacturing process.
Figure 18B:
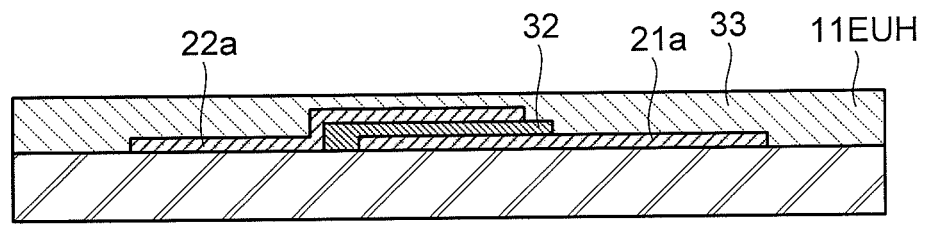

As illustrated in FIGS. 17A and 17B, the lower electrode 21, the sacrifice layer 32, and the upper electrode 22 are layered on the substrate 11EUH of an SOI wafer to form a device structure. Next, as illustrated in FIG. 18, the entirety of the structure is covered by a sacrifice layer 33.

Figure 19A:
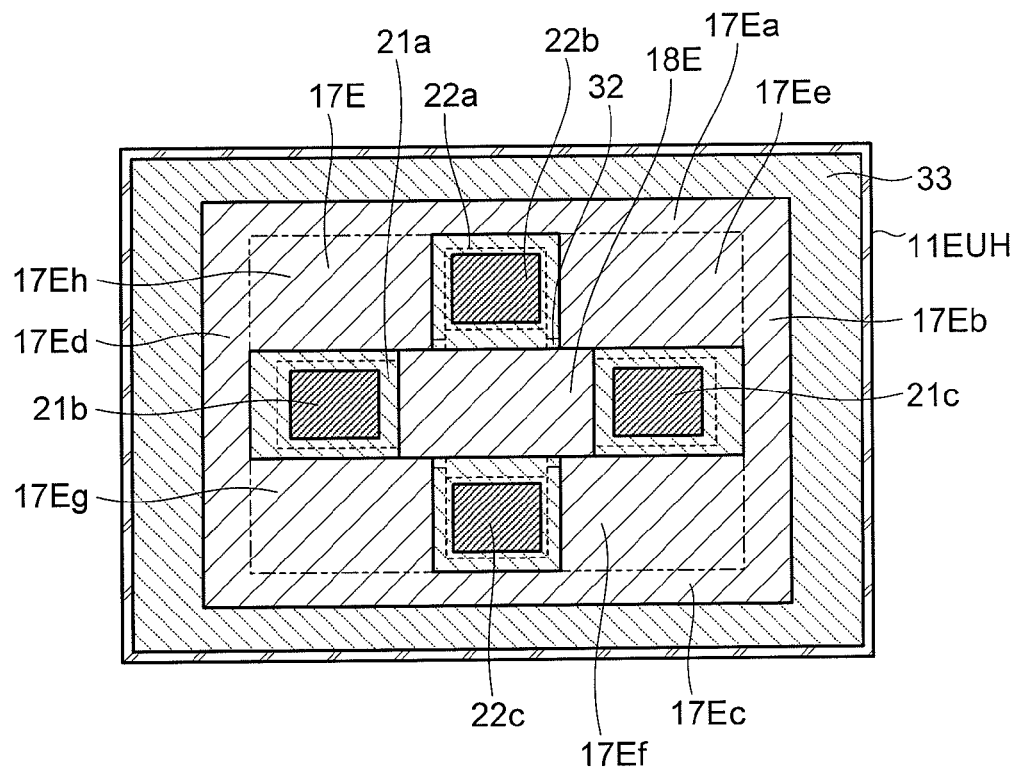
FIGS. 19A and 19B are front and cross sectional views, respectively, of the MEMS variable capacitor for describing an example of a manufacturing process.
Figure 19B:
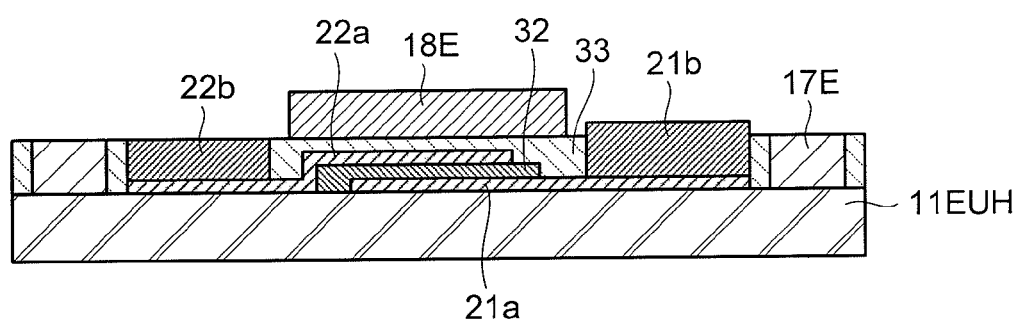

Then, patterning is carried out, and necessary seed layers are formed. Thereafter, as illustrated in FIGS. 19A and 19B, the anchor portions 21b, 21c, 22b, and 22c, the wall portion 17E, and the support portion 18E are simultaneously formed by plating using gold or the like. The thickness of the plating layer is about 20 μm. In such a process, the support portion 18E is formed by maintaining a gap between it and the upper electrode 22a over the area where the upper electrode 22a is in a bridge form. The gaps, in front view (plan view) between individual anchor portions 21b, 21c, 22b, and 22c and the wall portion 17E or the support portion 18E are all about 100 μm wide or smaller, preferably about 50 μm or smaller.

Figure 20A:
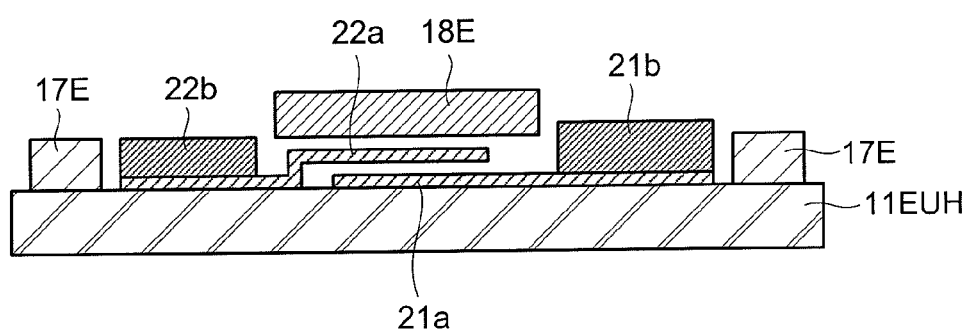
FIGS. 20A and 20B are cross sectional views of the MEMS variable capacitor for describing an example of a manufacturing process.
Figure 20B:
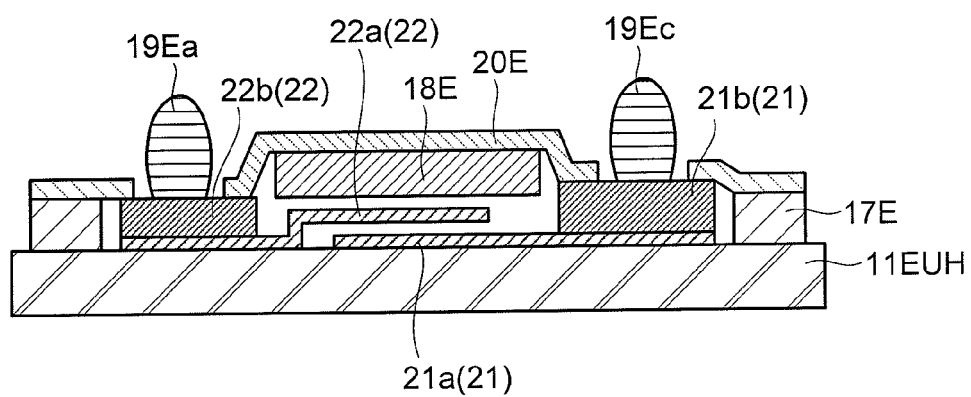

Next, as illustrated in FIG. 20A, the sacrifice layer 32 and 33 are all removed. Then, as illustrated in FIG. 20B, the film member 20E is bonded and fixed on the top surfaces of the wall portion 17E and the support portion 18E. Thereafter, the film member 20E is provided with holes in which the bumps 19E are fitted.

Finally, the substrate 11UH is diced along the borders between the wall portions 17E of individual functional portions KN to complete the MEMS variable capacitor 1E. In the MEMS variable capacitor 1E, since the functional portion KN including the lower electrode 21, the upper electrode 22, and the like is protected by the wall portion 17E and the film member 20E, the MEMS variable capacitor 1E, as is, can be mounted on a printed board or the like.

Sixth Embodiment

Next, with reference to FIGS. 21-24, a description will be given of a MEMS switch 1F according to the sixth embodiment.

Figure 21:
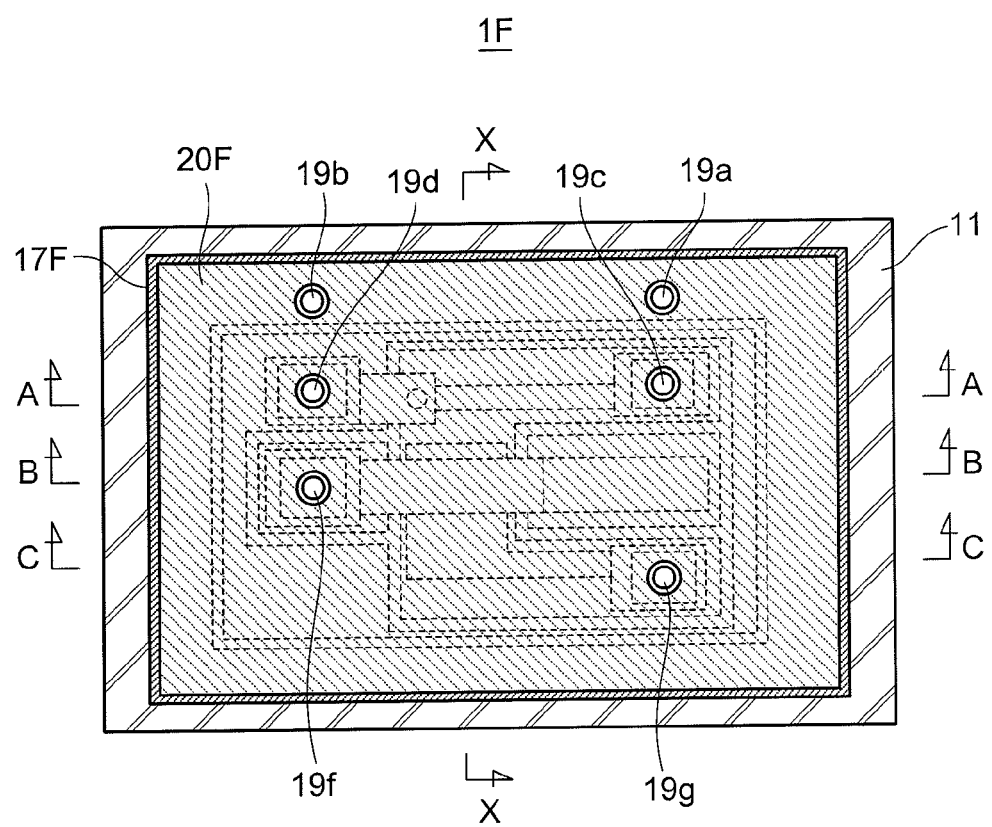
FIG. 21 is a front view of a MEMS switch according to the sixth embodiment.
Figure 22:
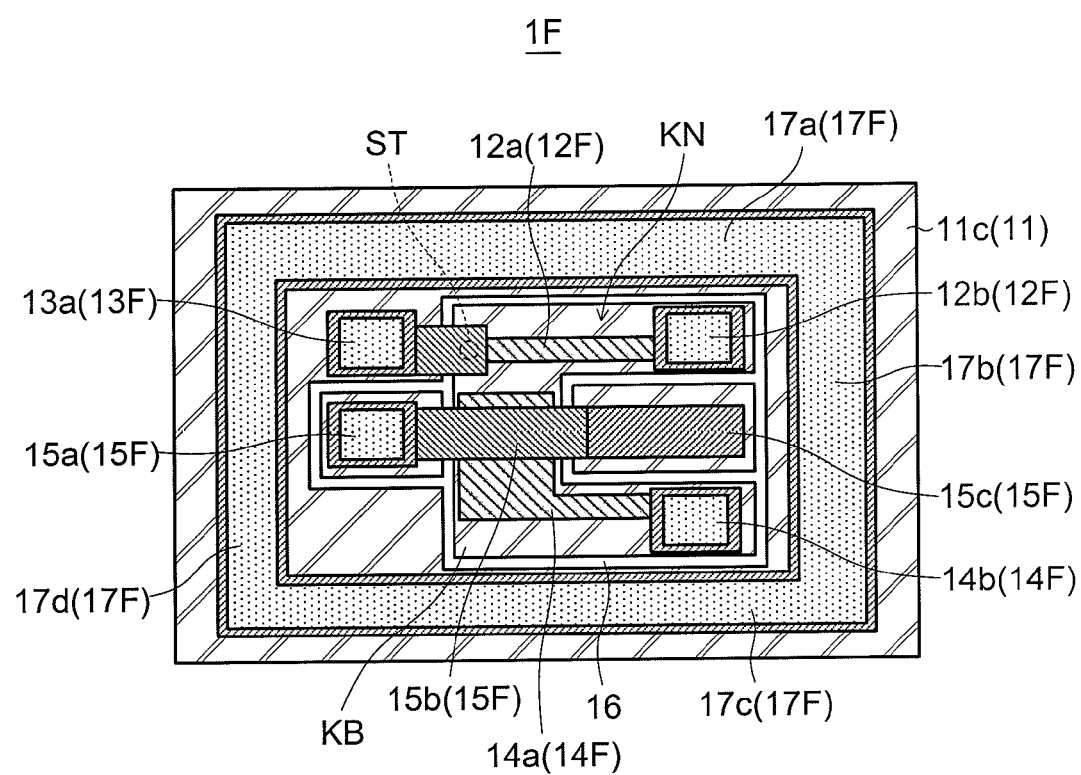
FIG. 22 is a front view of the MEMS switch illustrated in FIG. 21 while a film member is unillustrated.
Figure 23A:
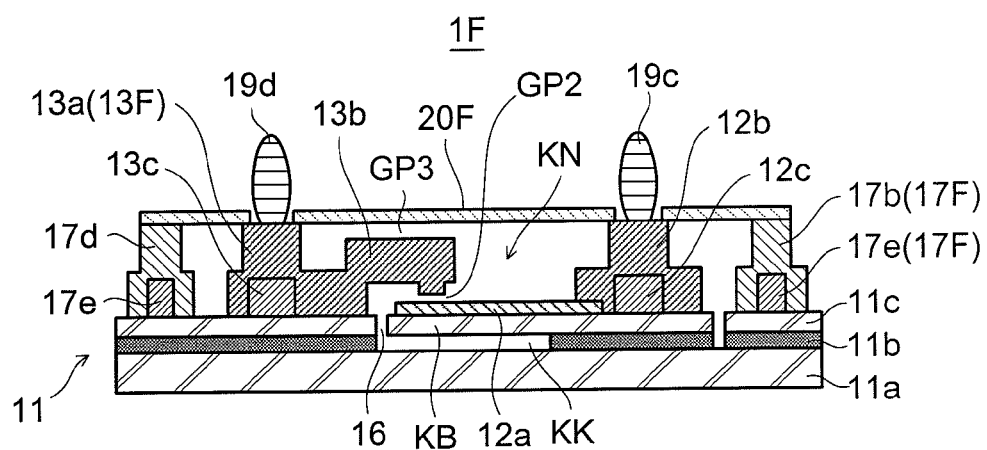
FIGS. 23A, 23B, and 23C are cross sectional views of the MEMS switch illustrated in FIG. 21.
Figure 23B:
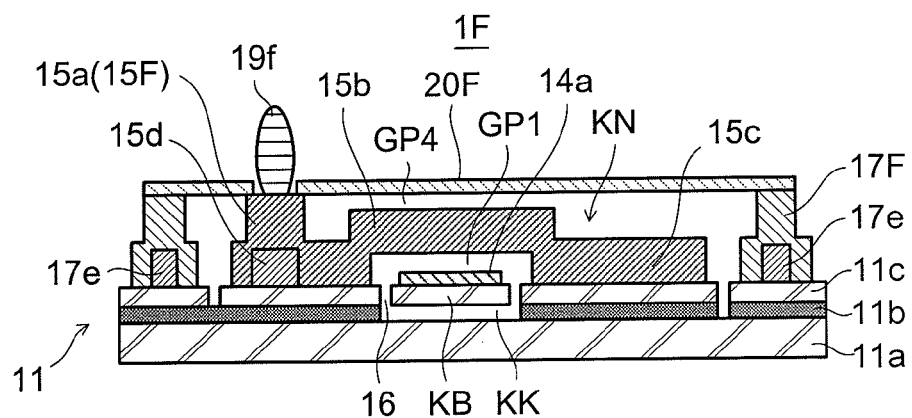
Figure 23C:
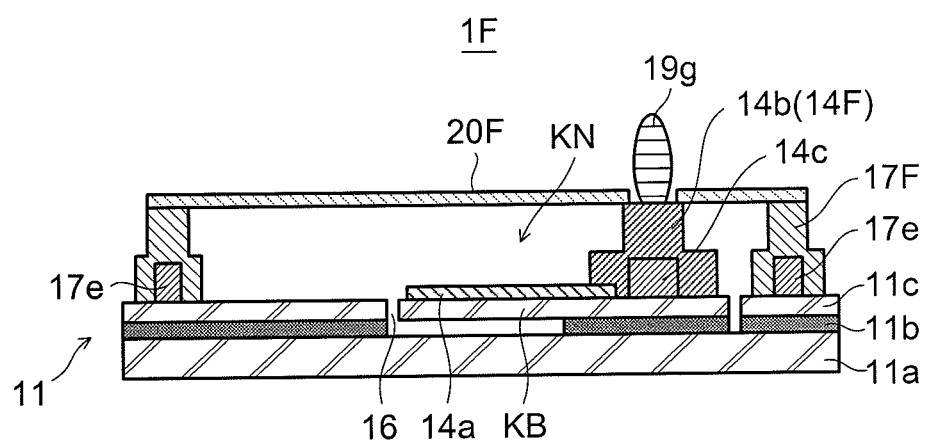

In FIG. 22, the MEMS switch 1F is illustrated while the bumps 19F and a film member 20F are omitted. FIGS. 23A, 23B, and 23C are cross sectional views of the MEMS switch 1F taken along lines A-A, B-B, and C-C illustrated in FIG. 21, respectively.

Figure 24:
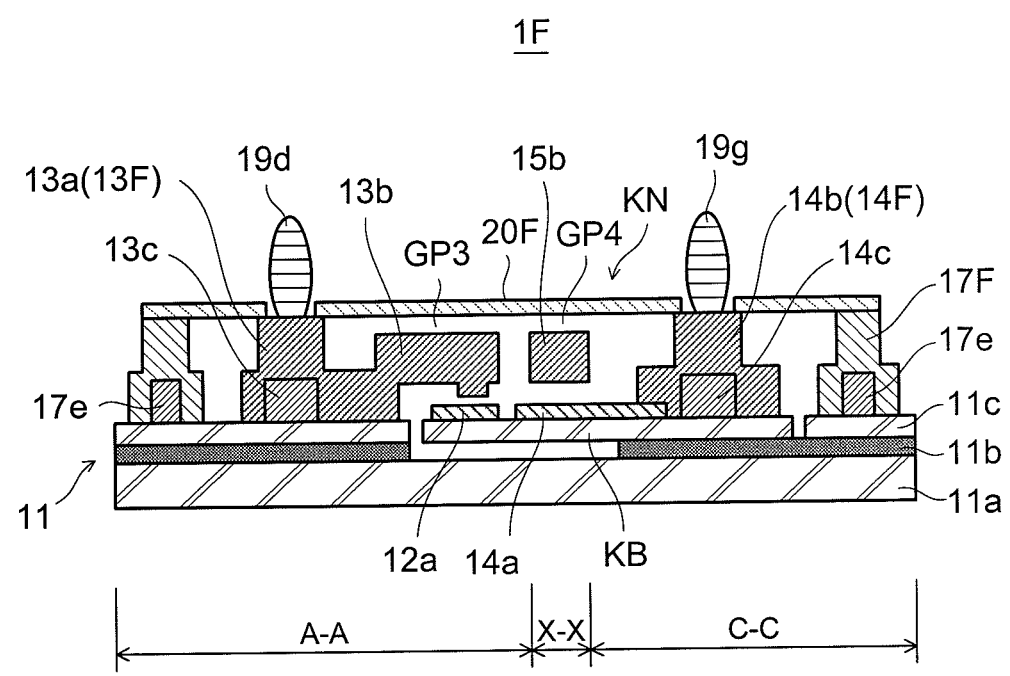
FIG. 24 is a cross sectional view of the MEMS switch illustrated in FIG. 21.

FIG. 24 is a cross sectional view of the MEMS switch 1F illustrated in FIG. 21 taken along a staircase line, and a part of which is arranged as a revolved cross sectional view. In other words, portions indicated by "A-A", "X-X", and "C-C" in FIG. 24 correspond to cross sectional views taken along lines A-A, X-X, and C-C in FIG. 21, respectively. However, the portion taken along line X-X is partially omitted. The same is also applied to FIGS. 25A-25C, 26A-26B, and 28.

In the MEMS switches 1 and 1B-1D according to the first to fourth embodiments, respectively, the stationary contact portion 13b and the electrode opposing portion 15b are formed higher than the wall portion 17. For this reason, the film member 20 that is stretched by being fixed to the wall portion 17 makes contact with the top surfaces of the stationary contact portion 13b and the electrode opposing portion 15b as well.

Accordingly, the stationary contact portion 13b and the electrode opposing portion 15b are possibly pressed toward the substrate 11 by the tension of the film member 20, the pressure exerted from above, or the like. Therefore, it is necessary to ensure adequate strength of the stationary contact portion 13b and the electrode opposing portion 15b so that the stationary contact portion 13b and the electrode opposing portion 15b do not touch the electrode portions 12a and 14a by accident.

In the MEMS switch 1F according to the sixth embodiment described hereinafter, the wall portion 17F is formed higher than the stationary contact portion 13b and the electrode opposing portion 15b. As a result, the film member 20F that is stretched by being fixed to the wall portion 17F does not make contact with the stationary contact portion 13b and the electrode opposing portion 15b.

Referring to FIGS. 21-24, the MEMS switch 1F is formed of a substrate 11, a movable contact electrode 12F, a stationary contact electrode 13F, a movable driving electrode 14F, a stationary driving electrode 15F, a wall portion 17F, a bump 19, the film member 20F, and so on.

The substrate 11 is an SOI (Silicon On Insulator) substrate formed of three layers of a support substrate 11a, an intermediate oxide film 11b, and an active layer 11c.

The active layer 11c is provided with a slit 16 having a substantially horizontal U-shape in front view (plan view), which defines the movable portion KB. The intermediate oxide film 11b corresponding to a region including the movable portion KB is removed to provide space KK. As a result of this, the movable portion KB constitutes a cantilever having its fulcrum in a portion where the slit 16 is not provided. This arrangement allows an end edge portion opposite to the fulcrum to move upward and downward in FIGS. 3A-3C.

As illustrated in FIG. 23A, the movable contact electrode 12 includes a long slender electrode portion 12a formed in close contact with the movable portion KB, and an anchor portion 12b formed on one end of the electrode portion 12a.

The anchor portion 12b is provided therein with a remaining portion (staying portion) of a sacrifice layer formed during a manufacturing process as a remaining sacrifice layer 12c. Because of the remaining sacrifice layer 12c, the anchor portion 12b has a two-step shape. The upper step portion thereof is formed higher than the stationary contact portion 13b.

The stationary contact electrode 13F includes an electrode base 13a formed in close contact with the active layer 11c, and a stationary contact portion 13b provided continuously to the electrode base 13a and in a facing manner above the electrode portion 12a.

The electrode base 13a is provided therein with a remaining portion of a sacrifice layer as a remaining sacrifice layer 13c. Because of the remaining sacrifice layer 13c, the electrode base 13a has a two-step shape. The upper step portion thereof is as high as the upper step portion of the anchor portion 12b and higher than the stationary contact portion 13b and the electrode opposing portion 15b.

The stationary contact portion 13b is provided with a contact portion ST. The contact that can be opened and closed is formed between the electrode portion 12a and the stationary contact portion 13b, and is closed when the movable portion KB deforms upward to thereby bring the electrode portion 12a into contact with the stationary contact portion 13b.

As illustrated in FIG. 23C, the movable driving electrode 14F is formed of an electrode portion 14a including an elongated portion that is formed in close contact with the movable portion KB and a rectangular portion formed continuously on a tip end of the elongated portion, and the anchor portion 14b formed on one end of the electrode portion 14a.

The anchor portion 14b is provided therein with a remaining portion of a sacrifice layer as a remaining sacrifice layer 14c. Because of the remaining sacrifice layer 14c, the anchor portion 14b has a two-step shape. The upper step portion thereof is as high as the upper step portion of the anchor portion 12b and higher than the stationary contact portion 13b and the electrode opposing portion 15b.

As illustrated in FIG. 23B, the stationary driving electrode 15F includes electrode bases 15a and 15c that are formed in close contact with the active layer 11c, and an electrode opposing portion 15b that is supported by the electrode bases 15a and 15c and forms a bridge straddling over the movable portion KB. The electrode opposing portion 15b faces the rectangular portion of the electrode portion 14a thereabove.

The electrode base 15a is provided therein with a remaining portion of a sacrifice layer as a remaining sacrifice layer 15d. Because of the remaining sacrifice layer 15d, the electrode base 15a has a two-step shape. The upper step portion thereof is as high as the upper step portion of the anchor portion 12b and higher than the stationary contact portion 13b and the electrode opposing portion 15b.

In this way, in the MEMS switch 1F, the anchor portions 12b, the electrode base 13a, the anchor portion 14b, and the electrode base 15a all have the same height and are higher than the stationary contact portion 13b and the electrode opposing portion 15b.

A metallic material, for example, gold is used as a material of the movable contact electrode 12F, the stationary contact electrode 13F, the movable driving electrode 14F, and the stationary driving electrode 15F.

The wall portion 17F is formed, on the substrate 11, in a rectangular frame shape so as to surround the movable contact electrode 12F, the stationary contact electrode 13F, the movable driving electrode 14F, the stationary driving electrode 15F, and the like. To be specific, the wall portion 17 is formed of four side portions 17a-17d having the same height (thickness).

The side portions 17a-17d are provided therein with a remaining portion of a sacrifice layer as a remaining sacrifice layer 17e. The remaining sacrifice layer 17e is provided in a rectangular frame shape along individual side portions 17a-17d. Because of the remaining sacrifice layer 17e, each of the side portions 17a-17d has a two-step shape.

The upper step portions of the side portions 17a-17d are formed to be as high as the anchor portion 12b, the electrode base 13a, the anchor portion 14b, and the electrode base 15a. As a result of this, the upper step portions of the side portions 17a-17d are higher than the stationary contact portion 13b and the electrode opposing portion 15b. Here, the wall portion 17F is connected to the ground potential.

The film member 20F is disposed to cover the movable contact electrode 12F, the stationary contact electrode 13F, the movable driving electrode 14F, and the stationary driving electrode 15F thereabove, and has an edge portion thereof intimately fixed to a top surface of the wall portion 17F by welding (fusion bonding) or adhesion.

In other words, the film member 20F seals the internal space surrounded by the wall portion 17F so that the space is not exposed outside. The thickness of the film member 20F is about 20-50 μm.

The film member 20F is also fixed to the top faces of the anchor portion 12b, the electrode base 13a, the anchor portion 14b, and the electrode base 15a by welding or adhesion.

A film having heat resistance and insulation properties is used as a material for the film member 20F. For example, a material such as a liquid crystal polymer or polyimide is used. As illustrated in FIG. 4, it is also possible to adapt a double-film structure by using a material having high moisture-proof properties.

The film member 20F is provided with a plurality of holes by laser for wiring, and a plurality of bumps 19 are individually provided in the plurality of holes. To be more specific, the film member 20F is provided with the holes in positions corresponding to top surfaces of the two end portions of the side portion 17a, the electrode base 13a, the electrode base 15a, and the anchor portion 14b, and bumps 19a-19g are provided in the holes.

In the MEMS switch 1F according to the embodiment described above, the functional portion KN formed of the movable contact electrode 12F, the stationary contact electrode 13F, the movable driving electrode 14F, the stationary driving electrode 15F, and the like which are formed on the substrate 11 are surrounded by the wall portion 17F, and covered and sealed by the film member 20F, which provides a packaging structure.

The wall portion 17F is higher than the functional portion KN including the stationary contact portion 13, the electrode opposing portion 15b, and the like. For this reason, there are a gap GP3 provided between the film member 20F and the stationary contact portion 13b and a gap GP4 between the film member 20F and the electrode opposing portion 15b. Therefore, the film member 20F never makes contact with them. The sizes of the gaps GP3 and GP4 are a few μm, for example, about 2 μm.

Therefore, the tension of the film member 20F is not possibly applied to the stationary contact portion 13a and the electrode opposing portion 15b. Even if a pressure is applied above the film member 20F, the pressure is not exerted on them, or they are not pressed.

For this reason, the film member 20F by its deflection never touches the stationary contact portion 13b, the electrode opposing portion 15b, and the like, and therefore space required for the operation of the movable portion KB is secured.

Accordingly, the stationary contact portion 13b, the electrode opposing portion 15b, and the like can be arranged to have strengths to simply serve their original functions. Greater strengths taking account of an external force such as the one from the film member 20F are not necessary.

Although the height of the MEMS switch 1F increases by a few μm than those of the MEMS switches 1 and 1B-1D described earlier, it is still possible to make a reduction in profile and miniaturize the device as compared with a conventional device.

By providing the wall portion 17F and the film member 20F, it is possible to arrange a packaging structure, thereby prevent the manufacturing process from becoming complicated, and reduce the cost.

Since the remaining sacrifice layers 12c, 13c, 14c, 15d, and 17e which are remaining portions of the sacrifice layer formed during the manufacturing process can be utilized for increasing the height of the wall portion 17F or the like, it is possible to manufacture the device without increasing the number of processes, leading to a simplified manufacturing process.

It is also possible to manufacture the MEMS switch 1F by using a wafer as the substrate 11, forming a plurality of MEMS switches 1F on the wafer, and thereafter dicing the wafer into individual MEMS switches 1F.

To be specific, the movable contact electrodes 12F, the stationary contact electrodes 13F, the movable driving electrodes 14F, the stationary driving electrodes 15F, the wall portions 17F, and the like which correspond to the plurality of MEMS switches 1F are first formed on a single wafer; thereafter, the film member 20F is bonded thereon in a manner to cover the entire wafer; and then the bumps 19 are fitted. In this way, since a plurality of MEMS switches 1F are formed on a single wafer, the wafer is diced along the wall portions 17F.

With this arrangement, it becomes possible to arrange the MEMS switches 1F in a wafer level packaging structure and greatly simplify the process required for packaging. By the time the dicing is performed, the packaging has been already completed, and the functional portions KN have been sealed by the film member 20F. Therefore, the functional portions KN can be prevented from being damaged or deformed by the cutting fluid.

Additionally, since the film member 20F serving for packaging is supported by the top surfaces of the anchor portions 12b and 14b, and the electrode bases 13a and 15a, the film member 20F is not deformed or damaged when the dicing is performed or the device is used.

In the MEMS switch 1F, the signal line SL constituted by the movable contact electrode 12F and the stationary contact electrode 13F forms a coplanar structure (CPW) together with the side portion 17a of the wall portion 17F and the stationary driving electrode 15F. Therefore, the wall portion 17F is not only used for sealing but also used effectively for this purpose. This arrangement contributes to further miniaturizing the device.

Next, a description will be given of the method of manufacturing the MEMS switch 1F with reference to FIGS. 25A-26B. The cross sectional views in FIGS. 25A-26B are all taken along the same lines as applied to FIG. 24 for viewing the MEMS switch 1F illustrated in FIG. 22.

First, in this embodiment, a substrate 11UH of an SOI wafer as illustrated in FIG. 9 is prepared. As described with reference to FIG. 3, the substrate 11UH is formed of the support substrate 11a, the intermediate oxide film 11b, and the active layer 11c. A plurality of the functional portions KN are formed on the substrate 11UH of the wafer, the wall portion 17F and the film member 20F are formed, and thereafter dicing is performed to complete the MEMS switches 1. Hereinafter, a description will be given of only a portion corresponding to a single MEMS switch 1F.

Figure 25A:
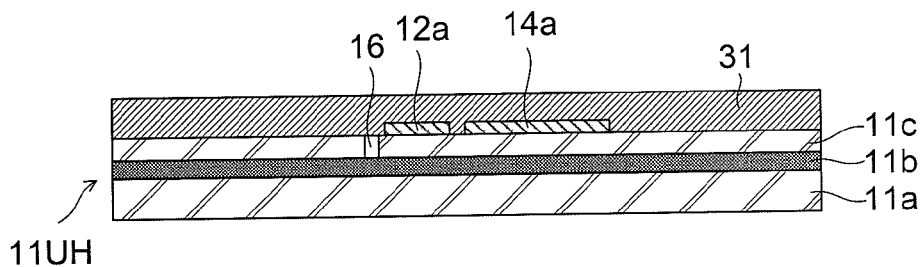
FIGS. 25A, 25B, and 25C are cross sectional views of the MEMS switch for describing an example of a manufacturing process.

In FIG. 25A, a film of chrome is formed to have a thickness of about 50 nm as a close-contact layer, and subsequently a film of gold is formed to have a thickness of about 500 nm on a surface of the active layer 11c by sputtering. Then, these are processed by photolithography and ion milling to simultaneously form the electrode portion 12a of the movable contact electrode 12F and the electrode portion 14a of the movable driving electrode 14F.

Next, two slits 16 having small and large horizontal U-shapes and having widths of about 2 μm, respectively, are worked in the perimeter of the electrode portions 12a and 14a by Deep-RIE (Reactive Ion Etching) to thereby form a portion of a cantilever. Then, this is followed by a formation of a sacrifice layer 31 by forming a film of silicon dioxide (SiO$_2$) of about 5 μm thick by plasma CVD (Chemical Vacuum Deposition) method.

Figure 5A:
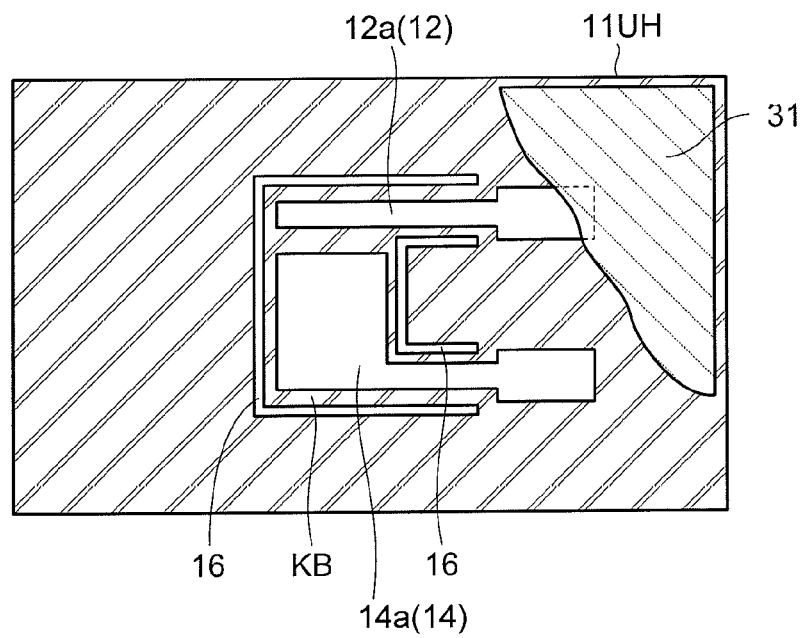
FIGS. 5A and 5B are front and cross sectional views, respectively, of the MEMS switch for describing an example of a manufacturing process.
Figure 5B:
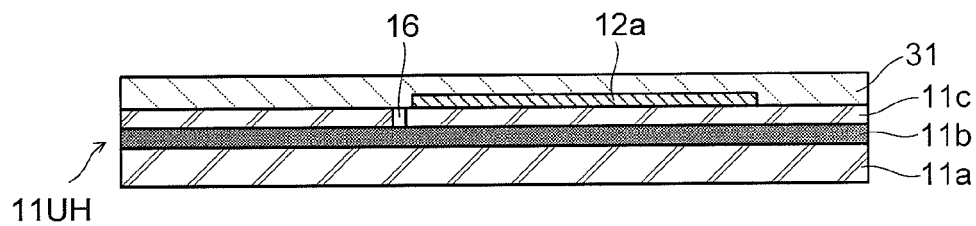

Here, the electrode portions 12a and 14a, and the slit 16 in plan view are illustrated in FIG. 5A.

Figure 25B:
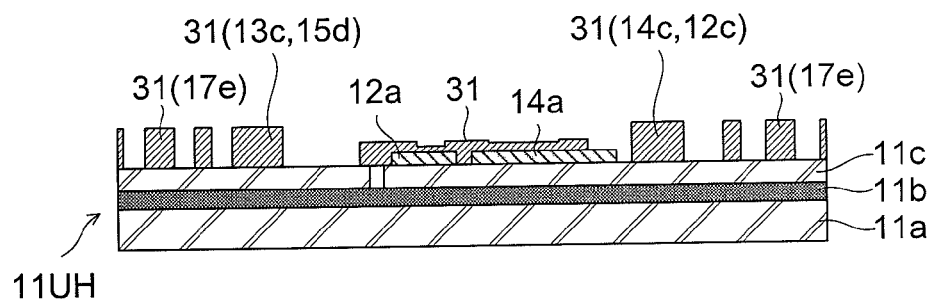

As illustrated in FIG. 25B, the sacrifice layer 31 is etched sequentially by photolithography and RIE. To be more specific, in order to allow the portions, whose levels are to be raised, such as the remaining sacrifice layers 12c, 13c, 14c, 15d, and 17e, and the portions in which electrodes are not formed, to remain (stay), half-etching is repeatedly performed on the other portions to form the sacrifice layer 31 in a predetermined pattern.

First, the sacrifice layer 31 is half-etched into a depth of about 4 μm for the portions in which the stationary contact portion 13b and the electrode opposing portion 15b are formed, a portion other than the remaining sacrifice layer 17e of the wall portion 17F, a portion other than the remaining sacrifice layer 12c of the anchor portion 12b, a portion other than the remaining sacrifice layer 13c of the electrode base 13a, a portion other than the remaining sacrifice layer 14c of the anchor portion 14b, and a portion other than the remaining sacrifice layer 15d of the electrode base 15a.

Next, the sacrifice layer 31 is further half-etched into a depth of about 0.5 μm for the portions in which the contact portion ST is formed, a portion other than the remaining sacrifice layer 17e of the wall portion 17F, a portion other than the remaining sacrifice layer 12c of the anchor portion 12b, a portion other than the remaining sacrifice layer 13c of the electrode base 13a, a portion other than the remaining sacrifice layer 14c of the anchor portion 14b, and a portion other than the remaining sacrifice layer 15d of the electrode base 15a.

Finally, the sacrifice layer 31 having a thickness of about 0.5 μm, which remains in the anchor portions 12b and 14b, the electrode bases 13a and 15a, the wall portion 17F, and the like, is all removed. With this process, the sacrifice layer 31 remains only in the portions of the remaining sacrifice layers 12c, 13c, 14c, 15d, and 17e, and the portions in which the electrodes are not formed.

The remaining sacrifice layers 12c, 13c, 14c, 15d, and 17e are allowed to remain in this way. Therefore, the number of half-etching process is not increased.

Then, a seed layer required for plating is formed by sputtering. The seed layer includes an under layer of molybdenum having a thickness of about 50 nm and an upper layer of gold having a thickness of about 300 nm.

Figure 25C:
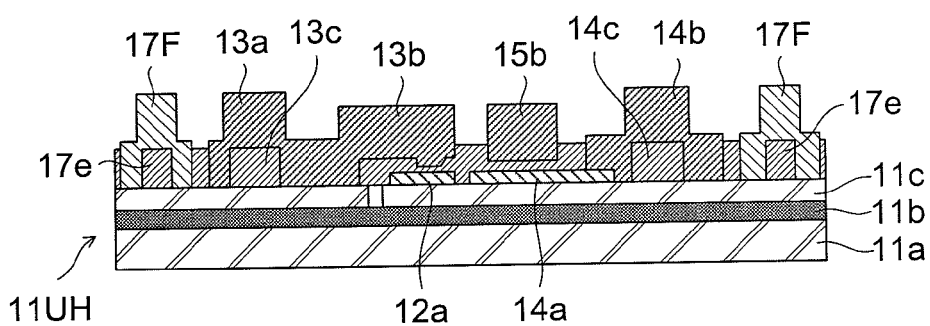

Next, as illustrated in FIG. 25C, a gold plating film is formed by plating method to have a thickness of about 20 μm. By this process, a gold plating film having the same thickness is simultaneously formed in each portion.

Specifically, the anchor portions 12b and 14b, the stationary contact electrode 13F, the stationary driving electrode 15F, and the wall portion 17F are simultaneously formed. Since these portions are formed simultaneously by plating, each of the portions has the same thickness.

In this way, the portions of the remaining sacrifice layers 12c, 13c, 15d, and 17e are entirely covered by the gold plating film.

Since the sacrifice layer 31 has been half-etched in advance in the stationary contact portion 13b and the electrode opposing portion 15b, these portions are made lower than the electrode base 13a, the anchor portion 14b, and the wall portion 17F.

Figure 26A:
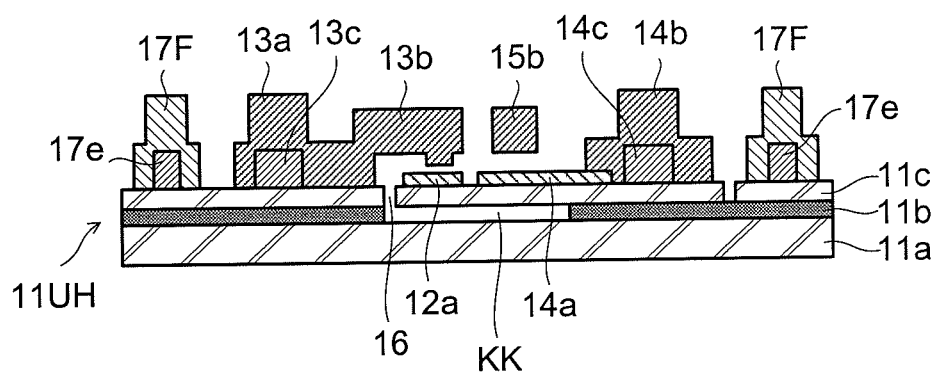
FIGS. 26A and 26B are cross sectional views of the MEMS switch for describing an example of a manufacturing process.

Next, parts of the seed layer that are not covered by the plating film are removed by ion milling and RIE. Then, as illustrated in FIG. 26A, the sacrifice layer 31 and the intermediate oxide film 11b under the cantilever are removed by etching using hydrofluoric acid. With this process, parts of the remaining sacrifice layers 12c, 13c, 14c, 15d, and 17e that are covered by the plating film stay as they are, because they have not been etched.

In addition, molybdenum of the under layer of the seed layer which is exposed on the surface of the contact portion ST protruding from the stationary contact portion 13b is removed by wet etching.

Figure 26B:
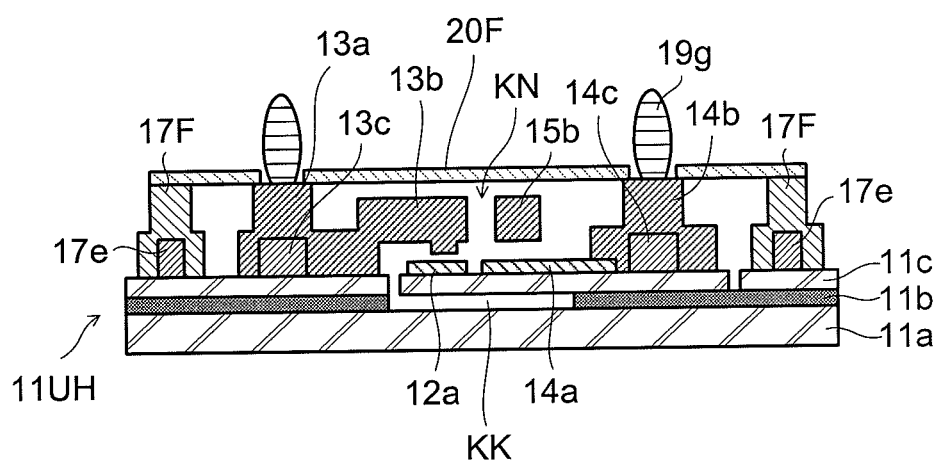

Then, as illustrated in FIG. 26B, the film member 20F in a film shape is bonded to an entire area of the substrate 11UH. This means that, by forming a flexible film of the film member 20F that is fixed to the top surface of the wall portion 17F, the functional portion KN including a plurality of structures is covered by the flexible film. During this process, it is not necessary to align the film member 20F and each of the wall portions 17F, but the film member 20F may simply be bonded to an entire area of the substrate 11UH.

To be specific, the substrate 11UH having the functional portion KN formed thereon is put into a chamber RM, the film member 20F is placed on the top surface of the substrate 11UH, and the film member 20F is pressed against the substrate 11UH by applying a predetermined high temperature and a predetermined pressure. Through this process, the film member 20F is welded to top surfaces of the anchor portions 12b and 14b, the electrode bases 13a and 15a, and the wall portion 17F.

The holes AN for the bumps 19 are provided in the film member 20F by laser beam machining. Then, individual bumps 19a-19g are fitted in the holes AN by welding or the like.

Finally, the substrate 11UG is diced along the borders between the wall portions 17F of individual functional portions KN to complete the MEMS switch 1F.

In the MEMS switch 1F, since the movable portion KB is protected by the wall portion 17F and the film member 20F, the MEMS switch 1F, as is, can be mounted on a printed board or the like.

In this way, according to this embodiment, it is possible to realize a wafer level package with a minimum number of processes, and realize miniaturization, a reduction in profile, and a reduction in loss.

Furthermore, the upper surfaces of the stationary contact portion 13b and the electrode opposing portion 15b are lower than the lower surface of the film member 20F by about 2 μm and therefore do not receive pressure from the film member 20F, which makes it possible to maintain the gaps GP3 and GP4 located thereunder.

Seventh Embodiment

Next, referring to FIG. 27, a description will be given of a MEMS switch 1G according to the seventh embodiment. Hereinafter, the description will be given of only those portions that are different from the sixth embodiment.

Figure 27:
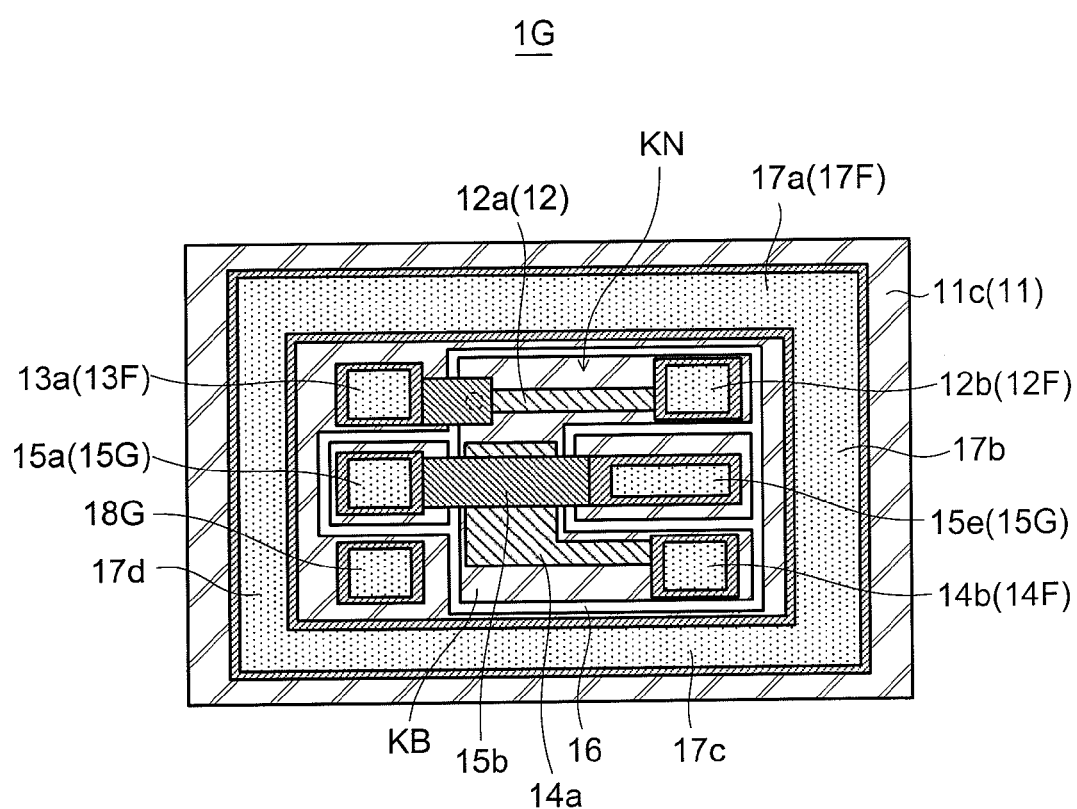
FIG. 27 is a front view of a MEMS switch according to the seventh embodiment.

FIG. 27 is a front view of the MEMS switch 1G according to the seventh embodiment. In FIG. 27, the film member 20F and the bumps 19 are omitted from the illustration.

In FIG. 27, as compared with the MEMS switch 1F described above, a support portion 18G is added, and an electrode base 15e that is taller than the electrode base 15c is formed in the MEMS switch 1G.

This means that the support portion 18G having the same height as those of the electrode bases 13a and 15a is provided on the substrate 11. As in the case of the electrode bases 13a and 15a, the support portion 18G is provided therein with a remaining portion of the sacrifice layer 31 that is formed during the manufacturing process as a remaining sacrifice layer. Because of the remaining sacrifice layer, similar to the electrode base 13a, the support portion 18G is formed in a two-step shape and has an upper step portion thereof having the height same as those of the electrode bases 13a and 15a, the wall portion 17F, and the like.

The electrode base 15e is also provided therein with a remaining portion of the sacrifice layer 31 formed during the manufacturing process as a remaining sacrifice layer. Because of the presence of the remaining sacrifice layer, the electrode base 15e has a two-step shape similar to that of the electrode base 15a. The upper step portion thereof is as high as the electrode base 15a and the wall portion 17F.

The unillustrated film member 20F is placed above the movable contact electrode 12F, the stationary contact electrode 13F, the movable driving electrode 14F, and the stationary driving electrode 15F so as to cover these components, and an edge portion of the film member 20F is made close contact with and fixed by welding (fusion bonding), adhesion, or the like to the top surface of the wall portion 17F. The film member 20F is also welded to the top surfaces of the anchor portions 12b and 14b, the electrode bases 13a, 15a, and 15e, and the support portion 18G.

In this way, in the MEMS switch 1G according to this embodiment, the film member 20F is fixed and supported at a larger number of locations. As a result, the film member 20F is firmly fixed and securely prevented from being deflected.

The addition of the support portion 18G is particularly effective for such a device as an mPnT switch in which the number of inputs (m) and the number of outputs (n) are large, the scale of the device is large, and the space enclosed by the wall portion 17F is large.

Eighth Embodiment

Next, referring to FIG. 28, a description will be given of a MEMS switch 1H according to the eighth embodiment. Hereinafter, the description will be given of only those portions that are different from the sixth embodiment.

Figure 28:
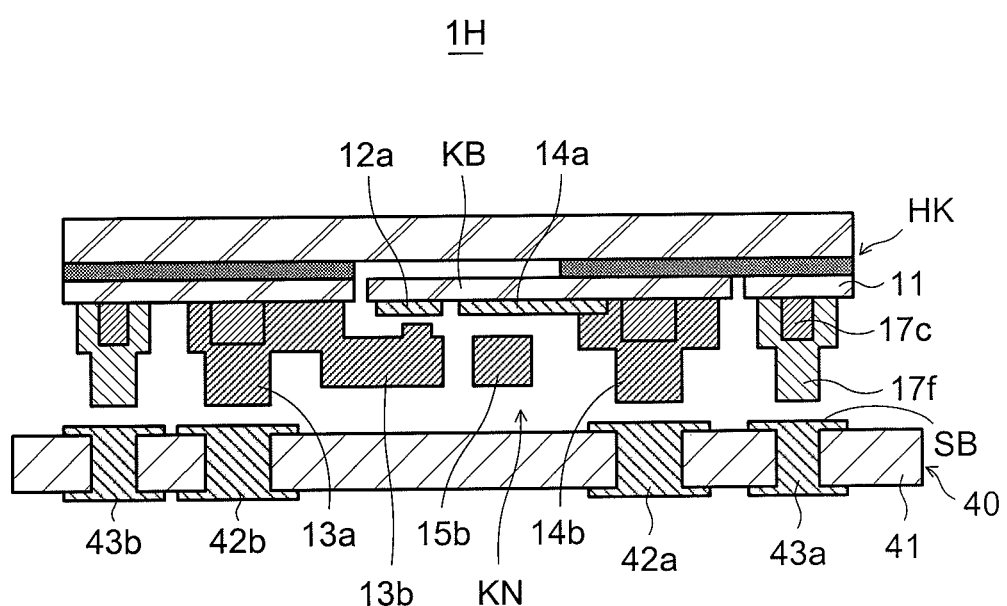
FIG. 28 is a cross sectional view of a MEMS switch according to the eighth embodiment.
Figure 29:
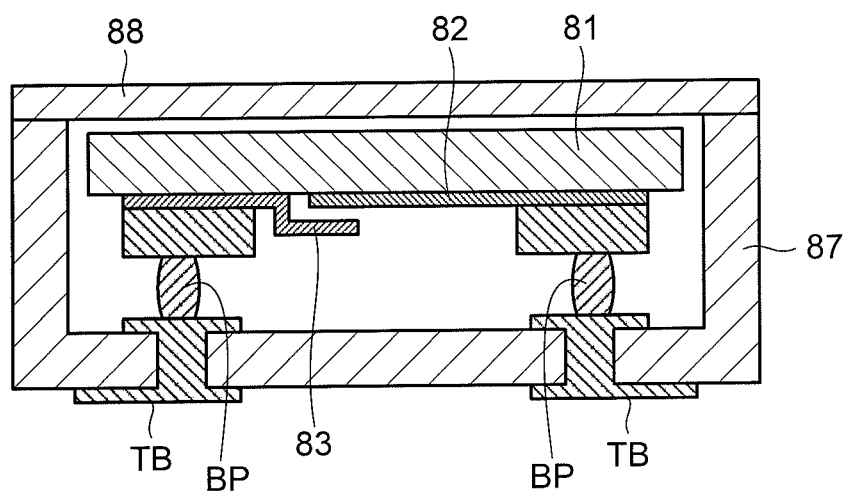
FIG. 29 is a cross sectional view illustrating a structure of a conventional MEMS switch.
Figure 30:
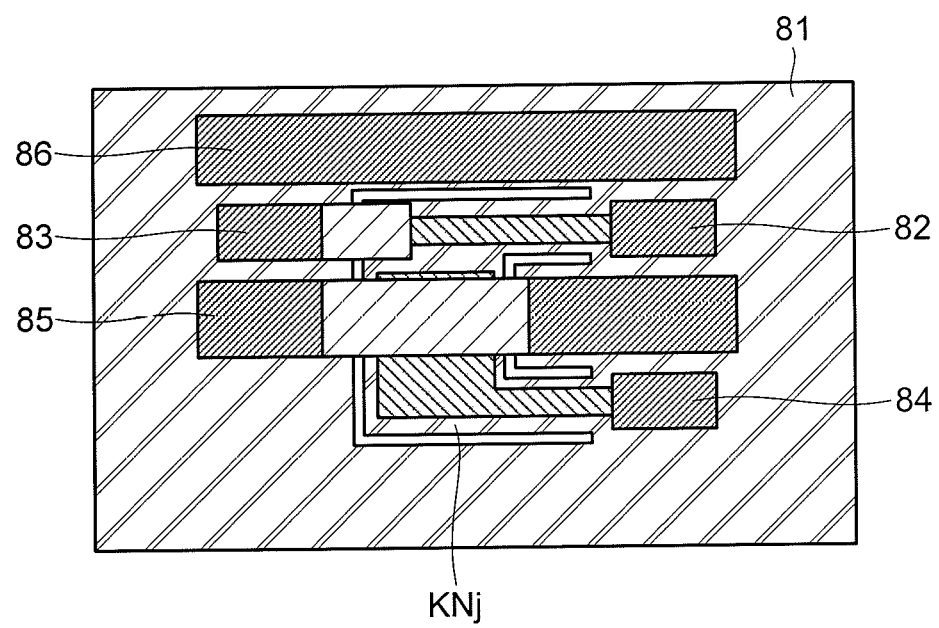
FIG. 30 is a front view illustrating a functional portion of the MEMS switch illustrated in FIG. 29.

FIG. 28 is a cross sectional view of the MEMS switch 1H according to the eighth embodiment.

In FIG. 28, as compared with the MEMS switch 1F described earlier, the MEMS switch 1H is not provided with the film member 20F and the bumps 19. Instead, a cap substrate 40 provided with through electrodes 42 and 43 is directly joined and fitted to a semifinished product HK.

The cap substrate 40 is formed by fitting the through electrodes 42 and 43 in the holes provided in appropriate positions of a ceramic substrate 41. The ceramic substrate 41 is formed of, for example, a ceramic material such as alumina into a plate shape having a thickness of about several tenths millimeters. A plurality of through electrodes 42a-42b, 43a-43b, and so on are provided to the positions corresponding to the top surfaces (bottom surfaces in the drawing) of the electrode bases 13a and 15a, the anchor portions 12b and 14b, and the wall portion 17F.

In FIG. 28, the semifinished product HK including the substrate 11 having the functional portion KN formed thereon is turned upside down, capped with the cap substrate 40, and sealed. A gap between the top surface of the wall portion 17F and the cap substrate 40 over an entire perimeter thereof is sealed with a sealing member SB. The top surfaces (bottom surfaces in the drawing) of the electrode bases 13a and 15a, the anchor portions 12b and 14b, and the wall portion 17F are welded and electrically connected to the through electrodes 42a-42b, 43a-43b, and so on. An appropriate inert gas such as nitrogen gas may be filled in the space where the functional portion KN is formed.

When the ceramic substrate 41 is fitted to the semifinished product HK, a single substrate having a plurality of cap substrates 40 formed thereon may be fitted to an entire group of a plurality of semifinished products HK formed on the substrate 11UH of a wafer, and dicing may be performed thereafter.

In this way, it is possible to realize a wafer level package with a minimum number of processes, and realize miniaturization, a reduction in profile, and a reduction in cost.

Alternatively, each of the cap substrates 40 may be fitted to each of the plurality of semifinished products HK formed on the substrate 11UH of wafer. It is also possible to fit a single cap substrate 40 to a single semifinished product HK.

It is also possible to fit, to an external surface of the cap substrate 40, another substrate or device to be connected to the through electrodes 42a-42b and 43a-43b.

In the embodiments described above, it is also possible to change the sizes, cross sectional shapes, or the like of the remaining sacrifice layers 12c, 13c, 14c, 15d, and 17e. In addition, it is also possible to alter the sizes, cross sectional shapes, or the like of the anchor portions 12b and 14b, the electrode bases 13a and 15a, and the wall portion 17F in the embodiments described above.

What have been discussed in the first to eighth embodiments above may be employed in and combined with a different embodiment or different embodiments so long as such combinations do not cause contradictions.

In the MEMS switches 1, 1B-1D, and 1F-1H, and the MEMS variable capacitor 1E according to the embodiments described above, the configuration, structure, form, dimensions, thickness, quantity, layouts, material, formation method, formation sequence, and the like of the entirety or individual portions thereof may be altered as required in accordance with the subject matter of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
a substrate;
a movable electrode provided above the substrate;
a stationary electrode that is provided to face the movable electrode;
a wall portion that is provided on the substrate and surrounds the movable electrode and the stationary electrode;
a film member that is fixed to the wall portion above the movable electrode and the stationary electrode, the film member sealing space including the movable electrode and the stationary electrode; and
a support portion that is provided, on an inner side of the wall portion on the substrate, in addition to the movable electrode and the stationary electrode to support the film member from within the space,
wherein the wall portion and at least a part of the support portion are integrally and continuously formed of an identical metallic material.

2. An electronic device comprising:
a substrate;
a movable electrode provided above the substrate;
a stationary electrode that is provided to face the movable electrode;
a wall portion that is provided on the substrate and surrounds the movable electrode and the stationary electrode;
a film member that is fixed to the wall portion above the movable electrode and the stationary electrode, the film member sealing space including the movable electrode and the stationary electrode; and
a support portion that is provided, on an inner side of the wall portion on the substrate, in addition to the movable electrode and the stationary electrode to support the film member from within the space,
wherein the wall portion is connected to a ground potential and has a part thereof provided in parallel with a signal line constituted of the movable electrode and the stationary electrode.

3. The electronic device according to claim 2,
wherein the film member comprises a sealing film including a photoresist and polyimide, and a protective film including silicon dioxide.

4. The electronic device according to claim 2,
wherein the film member is fixed to at least a part of the stationary electrode.

5. The electronic device according to claim 4,
wherein the support portion includes an opening portion that opens above the movable electrode, and
the movable electrode faces the film member through the opening portion.

6. An electronic device comprising:
a substrate;
a movable electrode provided above the substrate;
a stationary electrode that is provided to face the movable electrode;
a wall portion that is provided on the substrate and surrounds the movable electrode and the stationary electrode, the wall portion having a height higher than those of the movable electrode and the stationary electrode;
a film member that is fixed to the wall portion with gaps being provided between the film member and the movable electrode and between the film member and the stationary electrode, the film member sealing space including the movable electrode and the stationary electrode; and
an electrode base serving as a portion to support and electrically connect to the movable electrode or the stationary electrode on the substrate, the electrode base being formed to have a height equal to a height of the wall portion,
wherein the film member is supported by the electrode base from within the space,
the film member is a cap substrate including a plurality of through holes, and
the plurality of through holes are electrically connected to the electrode base and the wall portion.

7. The electronic device according to claim 6,
wherein the wall portion is formed to include a sacrifice layer remaining therein, the sacrifice layer having been used to form space between the movable electrode and the stationary electrode.

8. The electronic device according to claim 6, further comprising a support portion that is provided, on an inner side of the wall portion on the substrate, to support the film member from within the space.

* * * * *